United States Patent
Okajima et al.

(10) Patent No.: US 11,685,992 B2
(45) Date of Patent: *Jun. 27, 2023

(54) SUBSTRATE PROCESSING APPARATUS, QUARTZ REACTION TUBE AND METHOD OF MANUFACTURING SEMICONDUCTOR DEVICE

(71) Applicant: KOKUSAI ELECTRIC CORPORATION, Tokyo (JP)

(72) Inventors: Yusaku Okajima, Toyama (JP); Takafumi Sasaki, Toyama (JP); Hidenari Yoshida, Toyama (JP); Shuhei Saido, Toyama (JP); Mitsunori Ishisaka, Toyama (JP); Hidetoshi Mimura, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/738,384

(22) Filed: Jan. 9, 2020

(65) Prior Publication Data
US 2020/0149159 A1  May 14, 2020

Related U.S. Application Data

(63) Continuation of application No. PCT/JP2017/034542, filed on Sep. 25, 2017.

(51) Int. Cl.
*H01L 21/67* (2006.01)
*H01L 21/673* (2006.01)
(Continued)

(52) U.S. Cl.
CPC ...... *C23C 16/4405* (2013.01); *C23C 16/4412* (2013.01); *H01L 21/67017* (2013.01);
(Continued)

(58) Field of Classification Search
CPC ............ C23C 16/4405; C23C 16/4412; H01L 21/67017; H01L 21/67069; H01L 21/6733; H01L 21/68764; H01L 21/67248
(Continued)

(56) References Cited

U.S. PATENT DOCUMENTS 5,618,349 A   4/1997  Yuuki
5,846,073 A * 12/1998  Weaver .................. C30B 31/12
                                              432/241
(Continued)

FOREIGN PATENT DOCUMENTS

CN    106449469 A    2/2017
JP    07-037832 A    2/1995
(Continued)

OTHER PUBLICATIONS

Chinese Office Action dated Feb. 8, 2023 for Chinese Patent Application No. 201780092892.4.

*Primary Examiner* — Charlee J. C. Bennett
(74) *Attorney, Agent, or Firm* — Volpe Koenig

(57) ABSTRACT

According to one aspect thereof, there is provided a substrate processing apparatus including: a reaction tube including an outer tube and an inner tube; a manifold connected to an open end of the reaction tube; a lid configured to close one end of the manifold; a first gas supply pipe configured to supply a cleaning gas; and a second gas supply pipe configured to supply a purge gas of purging a space inside the manifold. The reaction tube includes: an exhaust space; an exhaust outlet communicating with the exhaust space; a first exhaust port provided in the inner tube so as to face a substrate accommodated in the inner tube; and second exhaust ports through which the exhaust space communicates with the space inside the manifold. At least one of the
(Continued)

second exhaust ports promotes gas exhaust in the exhaust space distanced away from the first exhaust port.

10 Claims, 11 Drawing Sheets

(51) Int. Cl.
*C23C 16/44* (2006.01)
*H01L 21/687* (2006.01)

(52) U.S. Cl.
CPC .... *H01L 21/6733* (2013.01); *H01L 21/67069* (2013.01); *H01L 21/68764* (2013.01); *H01L 21/67248* (2013.01)

(58) Field of Classification Search
USPC .................................................. 156/345.29
See application file for complete search history.

(56) References Cited

U.S. PATENT DOCUMENTS

| | | | |
|---|---|---|---|
| 9,401,272 | B2 | 7/2016 | Terasaki et al. |
| 9,437,421 | B2 | 9/2016 | Takebayashi et al. |
| 2003/0175650 | A1 | 9/2003 | Ridder et al. |
| 2010/0297832 | A1* | 11/2010 | Imai ........................ C30B 29/36 |
| | | | 427/249.15 |
| 2015/0191818 | A1* | 7/2015 | Yang .................... C23C 16/4412 |
| | | | 118/715 |
| 2015/0270125 | A1 | 9/2015 | Sasaki et al. |
| 2016/0245704 | A1* | 8/2016 | Osaka ....................... G01K 1/14 |
| 2017/0037512 | A1* | 2/2017 | Saido .................. C23C 16/4408 |
| 2017/0067159 | A1* | 3/2017 | Isobe ..................... C23C 16/403 |
| 2017/0087606 | A1 | 3/2017 | Nakamura et al. |
| 2017/0294318 | A1* | 10/2017 | Yoshida ............. H01L 21/02211 |
| 2019/0096738 | A1* | 3/2019 | Okajima ........... H01L 21/67109 |
| 2019/0287829 | A1* | 9/2019 | Saido ................ C23C 16/45546 |
| 2019/0287830 | A1* | 9/2019 | Saido .................... C23C 16/345 |
| 2019/0330738 | A1* | 10/2019 | Saido ................ C23C 16/45578 |
| 2021/0043485 | A1* | 2/2021 | Saido .................. C23C 16/4584 |
| 2021/0147978 | A1* | 5/2021 | Hisakado ........... C23C 16/45578 |

FOREIGN PATENT DOCUMENTS

| | | |
|---|---|---|
| JP | 07-193012 A | 7/1995 |
| JP | 2001-196364 A | 7/2001 |
| JP | 2010-147432 A | 7/2010 |
| JP | 2016-119343 A | 6/2016 |
| JP | 2017-069230 A | 4/2017 |
| KR | 10-2014-0097984 A | 8/2014 |
| KR | 10-2017-0016789 A | 2/2017 |
| KR | 10-2017-0037831 A | 4/2017 |
| KR | 10-2017-0042789 A | 4/2017 |
| TW | 201716621 A | 5/2017 |
| WO | 2004/027846 A1 | 4/2004 |

* cited by examiner

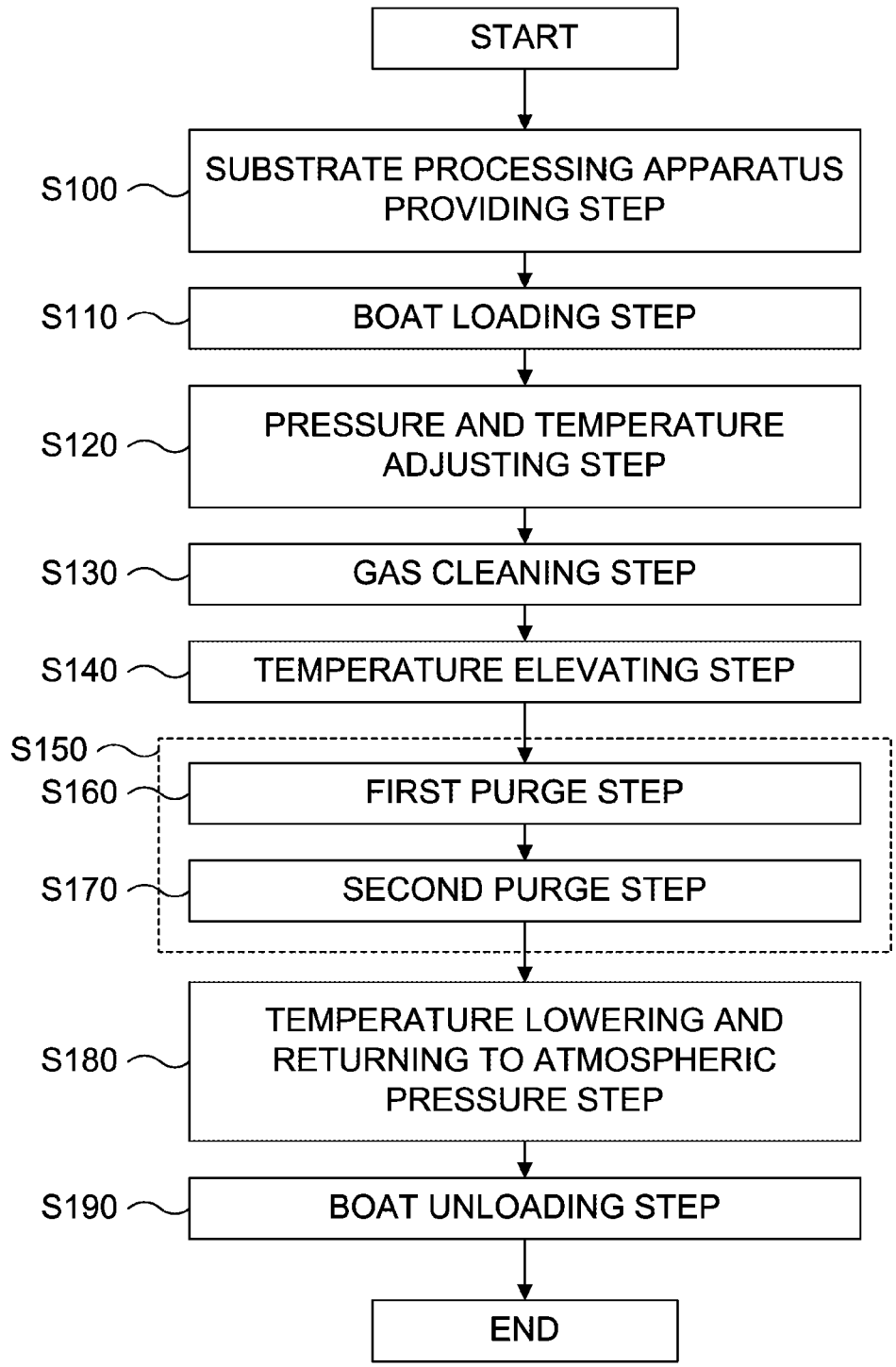

SUBSTRATE PROCESSING APPARATUS, QUARTZ REACTION TUBE AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of International Application No. PCT/JP2017/034542, filed on Sep. 25, 2017, in the WIPO, the entire contents of which are hereby incorporated by reference.

BACKGROUND

1. Field

The present disclosure relates to a substrate processing apparatus, a quartz reaction tube and a method of manufacturing a semiconductor device.

2. Description of the Related Art

In a heat treatment process of a substrate (also referred to as a "wafer"), which is one of manufacturing processes of a semiconductor device, a substrate processing apparatus such as a vertical type substrate processing apparatus may be used. For example, in the vertical type substrate processing apparatus, a plurality of substrates is charged (transferred) into a substrate retainer of the vertical the substrate processing apparatus and supported in a vertical direction by the substrate retainer. After the substrate retainer is loaded (transferred) into a process chamber of the vertical type substrate processing apparatus, a process gas is introduced into the process chamber while the plurality of the substrates is heated by a heater installed at an outside of the process chamber to thereby perform a substrate processing such as a film-forming process of forming a film on the plurality of the substrates. In addition, before the film attached to the process chamber is peeled off, a process such as a dry-cleaning process of removing the film attached to the process chamber may be performed. Conventionally, there is disclosed a technique of performing a cleaning process of the vertical type substrate processing apparatus using a double tube structure. In addition, there is disclosed another technique wherein, in order to improve an exhaust performance, an opening is provided in a part of a component such as a reaction tube of the vertical type substrate processing apparatus.

When the cleaning process of the process chamber is performed, various gases and various temperature conditions corresponding to the type of the film may be applied in order to effectively remove the film (target film) while suppressing the damage to components such as the process chamber. For example, it is possible to use a method of performing (repeating) a cycle including: (a) exposing the film to a first gas in order to modify (oxidize) the film so that the film can be easily removed; and (b) exposing the film to a second gas in order to remove the modified film after (a) is performed. In addition, when substances such as by-products generated due to the removal reaction of the second gas corrode the process chamber, the process chamber may be purged with an inert gas in order to quickly discharge (exhaust) the substances.

However, when a quartz reaction tube of the vertical type substrate processing apparatus is embodied by the double tube structure, a gas such as the process gas, the first gas and the second gas tends to stagnate in a space between an outer tube and an inner tube of the double tube structure. In such location where the gas tends to stagnate, a cleaning gas is supplied less and is exhausted slowly. As a result, the cleaning process may become incomplete or the time required for performing the cleaning process may be lengthened. In addition, by using the double tube structure, a gas such as a source gas may easily flow on the plurality of the substrates and a flow velocity of the gas such as the source gas flowing on the plurality of the substrates may be increased. However, an inert gas of purging a heat insulating space lower than a substrate processing position in the inner tube may easily flow into a substrate processing space of the process chamber. As a result, a thickness of the film formed on the substrate among the plurality of the substrates may vary depending on a vertical position where the substrate is disposed.

SUMMARY

Described herein is a technique capable of shortening a cleaning time.

According to one aspect of the technique of the present disclosure, there is provided a substrate processing apparatus including: a reaction tube including an outer tube with a closed end and an inner tube provide inside the outer tube, wherein the inner tube is configured to accommodate therein a substrate to be processed; a manifold of a cylindrical shape connected to an open end of the reaction tube; a lid configured to close one end of the manifold opposite to other end of the manifold connected to the reaction tube; a first gas supply pipe configured to supply a cleaning gas inside the reaction tube; and a second gas supply pipe configured to supply a purge gas of purging a space inside the manifold, wherein the reaction tube includes: an exhaust space formed between the outer tube and the inner tube into a C-shape in horizontal cross-section; an exhaust outlet formed on the outer tube and communicating with the exhaust space; a first exhaust port provided in the inner tube so as to face the substrate and configured to discharge a process gas; and a plurality of second exhaust ports formed along the exhaust space of C-shape, through which the exhaust space and the space inside the manifold communicate with each other, wherein at least one of the plurality of the second exhaust ports is configured to promote an exhaust of a stagnated gas in the exhaust space distanced away from the first exhaust port.

BRIEF DESCRIPTION OF THE DRAWINGS

FIG. 11 is a flow chart schematically illustrating a cleaning method according to the embodiments described herein.

DETAILED DESCRIPTION

Embodiments

Hereinafter, one or more embodiments (hereinafter, simply referred to as "embodiments") according to the technique of the present disclosure will be described with reference to the drawings.

Figure 1:
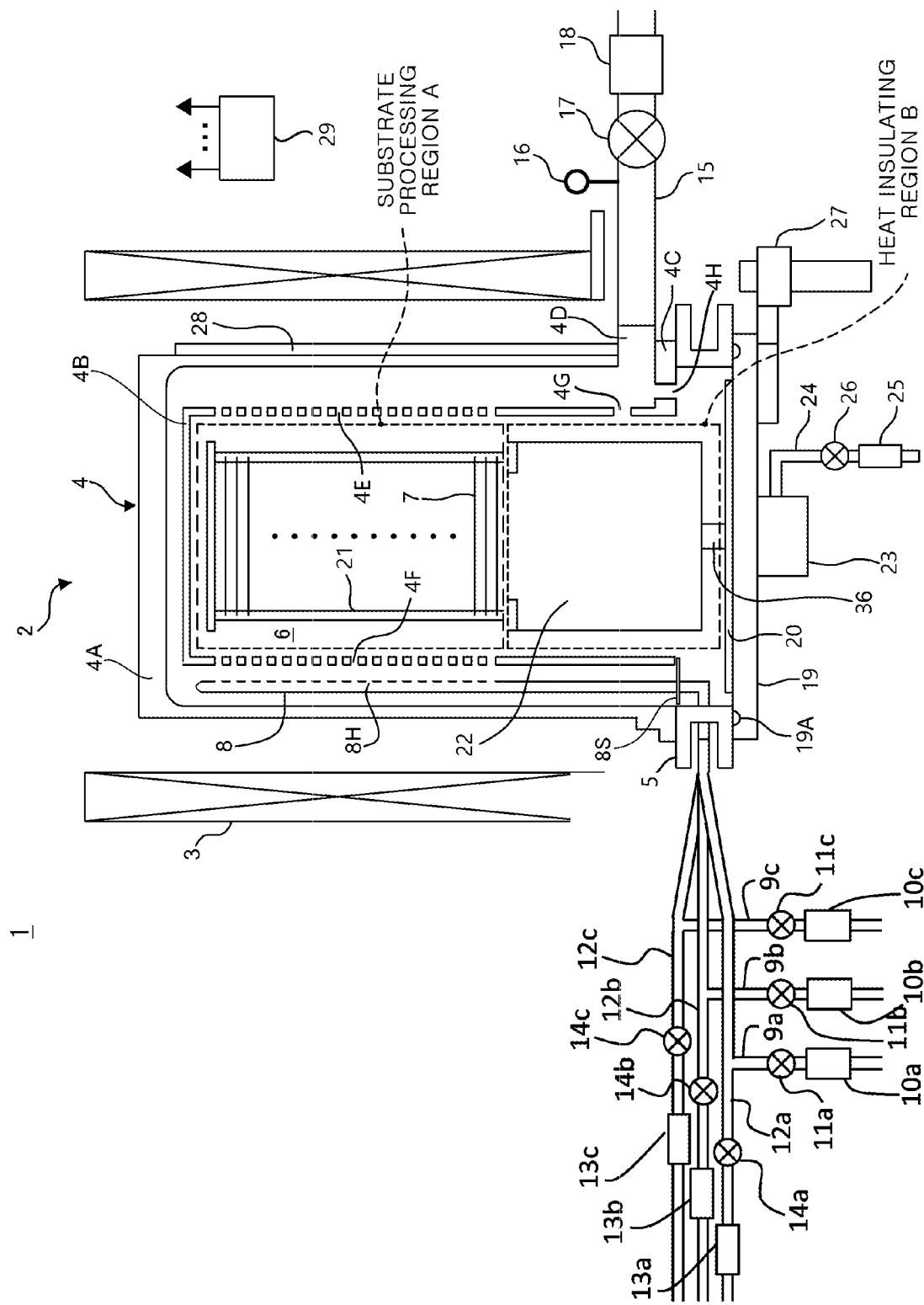
FIG. 1 schematically illustrates a vertical cross-section of a substrate processing apparatus according to one or more embodiments described herein.

As shown in FIG. 1, a substrate processing apparatus 1 according to the embodiments described herein is configured as a vertical type heat treatment apparatus capable of performing a heat treatment process in manufacturing processes of a semiconductor integrated circuit (IC). The substrate processing apparatus 1 includes a process furnace 2. The process furnace 2 includes a heater 3. In order to uniformly heat the process furnace 2, the heater 3 is constituted by a plurality of heater mechanisms. The heater 3 is of a cylindrical shape, and is installed perpendicular to an installation floor of the substrate processing apparatus 1 while being supported by a heater base (not shown) serving as a support plate. The heater 3 also functions as an activation mechanism (also referred to as an "excitation mechanism") of activating (exciting) a gas such as a process gas described later by heat as described later.

A reaction tube 4 is provided on an inner side of the heater 3. A reaction vessel (also referred to as a "process vessel") is constituted by the reaction tube 4. For example, the reaction tube 4 is made of a heat resistant material such as quartz ($SiO_2$) and silicon carbide (SiC). The reaction tube 4 is of a cylindrical shape with an open lower end and a closed upper end. The reaction tube 4 is embodied by a double tube structure including an outer tube 4A and an inner tube 4B that are coupled to each other at a flange portion 4C. The flange portion 4C is provided at a lower portion of the reaction tube 4. Upper ends of the outer tube 4A and the inner tube 4B are closed and a lower end of the inner tube 4B is open. The flange portion 4C protrudes outward from an outer periphery of the reaction tube 4. An outer diameter of the flange portion 4C is greater than an outer diameter of the outer tube 4A. An exhaust outlet 4D communicating with an inside of the outer tube 4A is provided in the vicinity of the lower end of the reaction tube 4. The reaction tube 4 including the above described components such as the outer tube 4A and the inner tube 4B is formed as a single body of a single material. The outer tube 4A is relatively thick so as to withstand a pressure difference when the inside thereof is exhausted to vacuum.

A manifold 5 of a cylindrical shape or of a truncated cone shape is made of a metal or quartz, and is provided to support the lower end of the reaction tube 4. An inner diameter of the manifold 5 is greater than an inner diameter of the reaction tube 4 (and an inner diameter of the flange portion 4C). Thereby, an annular space described later is defined between the lower end of the reaction tube 4 (that is, the flange portion 4C) and a lid 19 described later. The space (the annular space) and/or related components surrounding the space may be collectively referred to as a "furnace opening portion".

The inner tube 4B is provided with a main exhaust port 4E and a plurality of supply slits 4F. The main exhaust port 4E is provided at the inner tube 4B closer to a center of the reaction tube 4 than the exhaust outlet 4D. The main exhaust port 4E is configured to communicate with an inside and an outside of the inner tube 4B on a side thereof. The main exhaust port 4E is also referred to as a "first exhaust port 4E". The plurality of supply slits 4F is provided at the inner tube 4B at positions opposite to the main exhaust port 4E. The main exhaust port 4E is a single vertically elongated opening portion that opens to a region where a plurality of wafers including a wafer 7 is disposed. Each of the plurality of supply slits 4F is a slit extending in a circumferential direction of the inner tube 4B. The plurality of supply slits 4F is arranged both in the horizontal direction and in the vertical direction so as to correspond to each of the plurality of wafers including the wafer 7.

In addition, the inner tube 4B is provided with a plurality of subsidiary exhaust ports (hereinafter, also referred to as "sub exhaust ports") 4G. The plurality of the sub exhaust ports 4G is also referred to as a "plurality of third exhaust ports 4G". The plurality of the sub exhaust ports 4G is provided at the inner tube 4B closer to the center of the reaction tube 4 than the exhaust outlet 4D and closer to a lower end opening of the reaction tube 4 than the main exhaust port 4E. The plurality of the sub exhaust ports 4G is configured to communicate with a process chamber 6 and an exhaust space S. The flange portion 4C is also provided with a bottom exhaust port 4H, a plurality of bottom exhaust ports 4J and a nozzle introduction hole 4K. The bottom exhaust port 4H and the plurality of the bottom exhaust ports 4J may be collectively referred to as a "plurality of second exhaust ports 4H and 4J". The bottom exhaust port 4H and the plurality of the bottom exhaust ports 4J are configured to communicate with the process chamber 6 and a lower end of the exhaust space S. That is, the lower end of the exhaust space S is closed by the flange portion 4C except where the bottom exhaust port 4H and the plurality of the bottom exhaust ports 4J are provided. The plurality of the sub exhaust ports 4G, the bottom exhaust port 4H and the plurality of the bottom exhaust ports 4J are configured to mainly exhaust a shaft purge gas described later.

Figure 4:
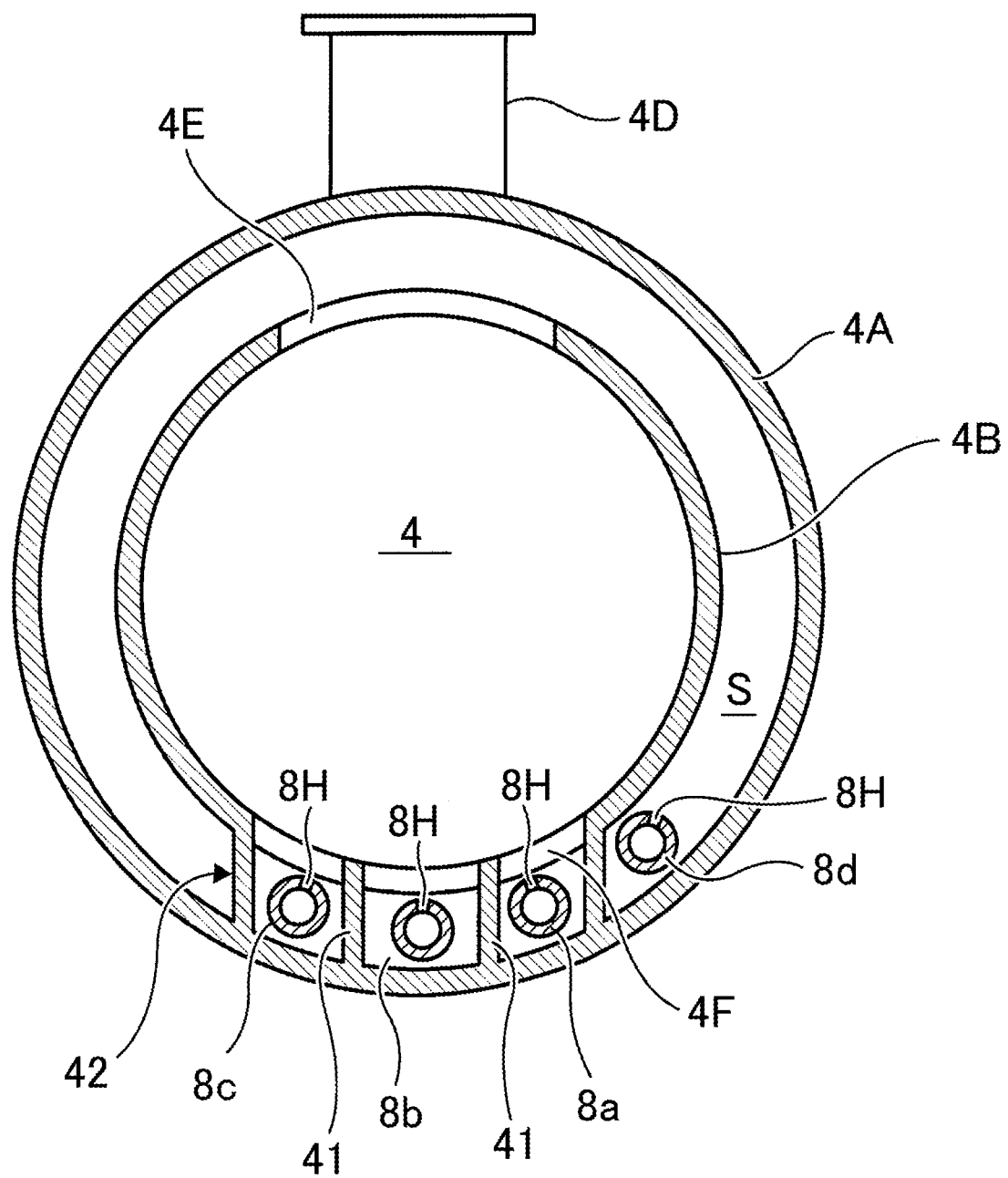
FIG. 4 schematically illustrates a horizontal cross-section of the reaction tube of the substrate processing apparatus according to the embodiments described herein.

In a space between the outer tube 4A and the inner tube 4B (hereinafter, also referred to as the "exhaust space S"), one or more nozzles 8 configured to supply the process gas such as a source gas are provided corresponding to the positions of the plurality of the supply slits 4F. As shown in FIG. 4, the one or more nozzles 8 are constituted by nozzles 8a, 8b, 8c and 8d. Gas supply pipes 9a, 9b and 9c configured to supply the process gas (the source gas) are connected to the nozzles 8a, 8b and 8c through the manifold 5, respectively.

Mass flow controllers (MFC) 10a, 10b and 10c serving as flow rate controllers (flow rate control mechanisms) and valves 11a, 11b and 11c serving as opening/closing valves are sequentially installed on flow paths of the gas supply pipes 9a, 9b and 9c, respectively, from the upstream sides to the downstream sides of the gas supply pipes 9a, 9b and 9c.

Gas supply pipes 12a, 12b and 12c configured to supply an inert gas are connected to the gas supply pipes 9a, 9b and 9c, respectively, at the downstream sides of the valves 11a, 11b and 11c. MFCs 13a, 13b and 13c and valves 14a, 14b and 14c are sequentially installed at the gas supply pipes 12a, 12b and 12c, respectively, from the upstream sides to the downstream sides of the gas supply pipes 12a, 12b and 12c. In the present specification, the components (elements) respectively connected to the nozzle 8 may also be collectively represented by a generic term. That is, for example, the gas supply pipes 9a, 9b and 9c may be collectively referred to as a "gas supply pipe 9", and the MFCs 10a, 10b and 10c may be collectively referred to as an "MFC 10". A process gas supply mechanism serving as a process gas supply system is constituted mainly by the gas supply pipe 9, the MFC 10 and a valve 11. In addition, a gas supply mechanism serving as a gas supply system is mainly constituted by the process gas supply mechanism, a MFC 13 and a valve 14.

The nozzle 8 is provided in a nozzle chamber (that is, one of a plurality of nozzle chambers 42 described later) so as to extend straight from a lower portion of the reaction tube 4 to an upper portion of the reaction tube 4. A nozzle hole or a plurality of nozzle holes 8H configured to supply the gas such as the process gas may be provided on an upper end of the nozzle 8 or a side surface of the nozzle 8. The plurality of the nozzle holes 8H corresponds to the openings of the plurality of supply slits 4F, respectively. The plurality of the nozzle holes 8H is open toward the center of the reaction tube 4. As a result, it is possible to inject (supply) the gas toward the plurality of the wafers including the wafer 7 through the inner tube 4B.

An exhaust pipe 15 configured to exhaust an inner atmosphere of the process chamber 6 is connected to the exhaust outlet 4D. A vacuum pump 18 serving as a vacuum exhaust apparatus is connected to the exhaust pipe 15 through a pressure sensor 16 and an APC (Automatic Pressure Controller) valve 17. The pressure sensor 16 serves as a pressure detector (also referred to as a "pressure detection mechanism") to detect an inner pressure of the process chamber 6, and the APC valve 17 serves as a pressure controller (also referred to as a "pressure adjusting mechanism"). With the vacuum pump 18 in operation, the APC valve 17 may be opened or closed to exhaust (vacuum-exhaust) the process chamber 6 or stop the vacuum exhaust. With the vacuum pump 18 in operation, an opening degree of the APC valve 17 may be adjusted based on the pressure detected by the pressure sensor 16, in order to control (adjust) the inner pressure of the process chamber 6. An exhaust system (also referred to as an "exhaust mechanism") is constituted mainly by the exhaust pipe 15, the APC valve 17 and the pressure sensor 16. The exhaust system may further include the vacuum pump 18.

The lid 19 serving as a furnace opening cover capable of airtightly sealing a lower end opening of the manifold 5 is provided under the manifold 5. The lid 19 is made of a metal such as SUS (stainless steel) and a nickel-base alloy, and is of a disk shape. An O-ring 19A serving as a sealing part is provided on an upper surface of the lid 19 so as to be in contact with the lower end of the manifold 5.

A cover plate 20 is provided on the upper surface of the lid 19 so as to protect a portion of the lid 19 inner than an inner periphery of the lower end of the manifold 5. The cover plate 20 is made of a heat and corrosion resistant material such as quartz, sapphire and SiC, and is of a disk shape. Since the cover plate 20 does not require much mechanical strength, the cover plate 20 may be formed with a small thickness. In addition, according to the embodiments, the cover plate 20 does not have to be prepared independently of the lid 19. For example, the cover plate 20 may be embodied by a film or a layer such as a nitride film coated on an inner surface of the lid 19 or a nitride film formed by modifying the inner surface of the lid 19. The cover plate 20 may further include a wall extending along an inner surface of the manifold 5 from a circumferential edge of the cover plate 20.

A boat 21 serving as a substrate retainer is configured to align the plurality of the wafers including the wafer 7, for example, from 25 to 200 wafers in the vertical direction and configured to support the plurality of the wafers, while the plurality of the wafers is horizontally oriented with their centers aligned with each other. That is, the boat 21 supports (accommodates) the plurality of the wafers including the wafer 7 with predetermined intervals therebetween. The boat 21 is made of a heat resistant material such as quartz and SiC. It may be preferable for the reaction tube 4 to have a minimum inner diameter that allows the boat 21 to be safely loaded (transferred) into the reaction tube 4 and unloaded (transferred) out of the reaction tube 4.

A heat insulating assembly 22 described later is disposed (provided) below the boat 21. The heat insulating assembly 22 is embodied by a structure in which conduction or transmission of the heat tends to reduce in the vertical direction, and usually a cavity is provided in the heat insulating assembly 22. It is possible to purge an inside of the heat insulating assembly 22 with the shaft purge gas. The upper portion of the reaction tube 4 where the boat 21 is disposed may be referred to as a "substrate processing region A", and the lower portion of the reaction tube 4 where the heat insulating assembly 22 is disposed may be referred to as a "heat insulating region B".

A rotating mechanism 23 configured to rotate the boat 21 is provided under the lid 19 opposite to the process chamber 6. A gas supply pipe 24 of the shaft purge gas is connected to the rotating mechanism 23. An MFC 25 and a valve 26 are sequentially installed at the gas supply pipe 24 from an upstream side to a downstream side of the gas supply pipe 24. One purpose of a purge gas (that is, the shaft purge gas) is to protect an inside of the rotating mechanism 23 (for example, bearings) from the gas such as a corrosive gas used in the process chamber 6. The purge gas is discharged (exhausted) from the rotating mechanism 23 along a shaft of the rotating mechanism 23 and is guided into the heat insulating assembly 22.

A boat elevator 27 is provided outside the reaction tube 4 vertically below the reaction tube 4. The boat elevator 27 serves as an elevating mechanism (also referred to as a "transfer mechanism") capable of elevating and lowering the lid 19. When the lid 19 is moved upward or downward by the boat elevator 27, the boat 21 placed on the lid 19 and the plurality of the wafers including the wafer 7 accommodated in the boat 21 may be transferred (loaded) into the process chamber 6 and be transferred (unloaded) out of the process chamber 6. There may be provided a shutter (not shown) configured to close the lower end opening of the manifold 5 instead of the lid 19 while the lid 19 is being lowered to a lowest position thereof.

A temperature detector 28 is installed on an outer wall of the outer tube 4A. The temperature detector 28 may be embodied by a plurality of thermocouples arranged in a vertical array. The state of electric conduction to the heater 3 may be adjusted based on the temperature detected by the temperature detector 28 such that the inner temperature of the process chamber 6 has a desired temperature distribution.

A controller 29 is constituted by a computer configured to control the entire part of the substrate processing apparatus 1. The controller 29 is electrically connected to the components of the substrate processing apparatus 1 such as the MFCs 10 and 13, the valves 11 and 14, the pressure sensor 16, the APC valve 17, the vacuum pump 18, the heater 3, a cap heater 34 described later, the temperature detector 28, the rotating mechanism 23 and the boat elevator 27, and is configured to receive signals from the components described above or to control the components described above.

Figure 2:
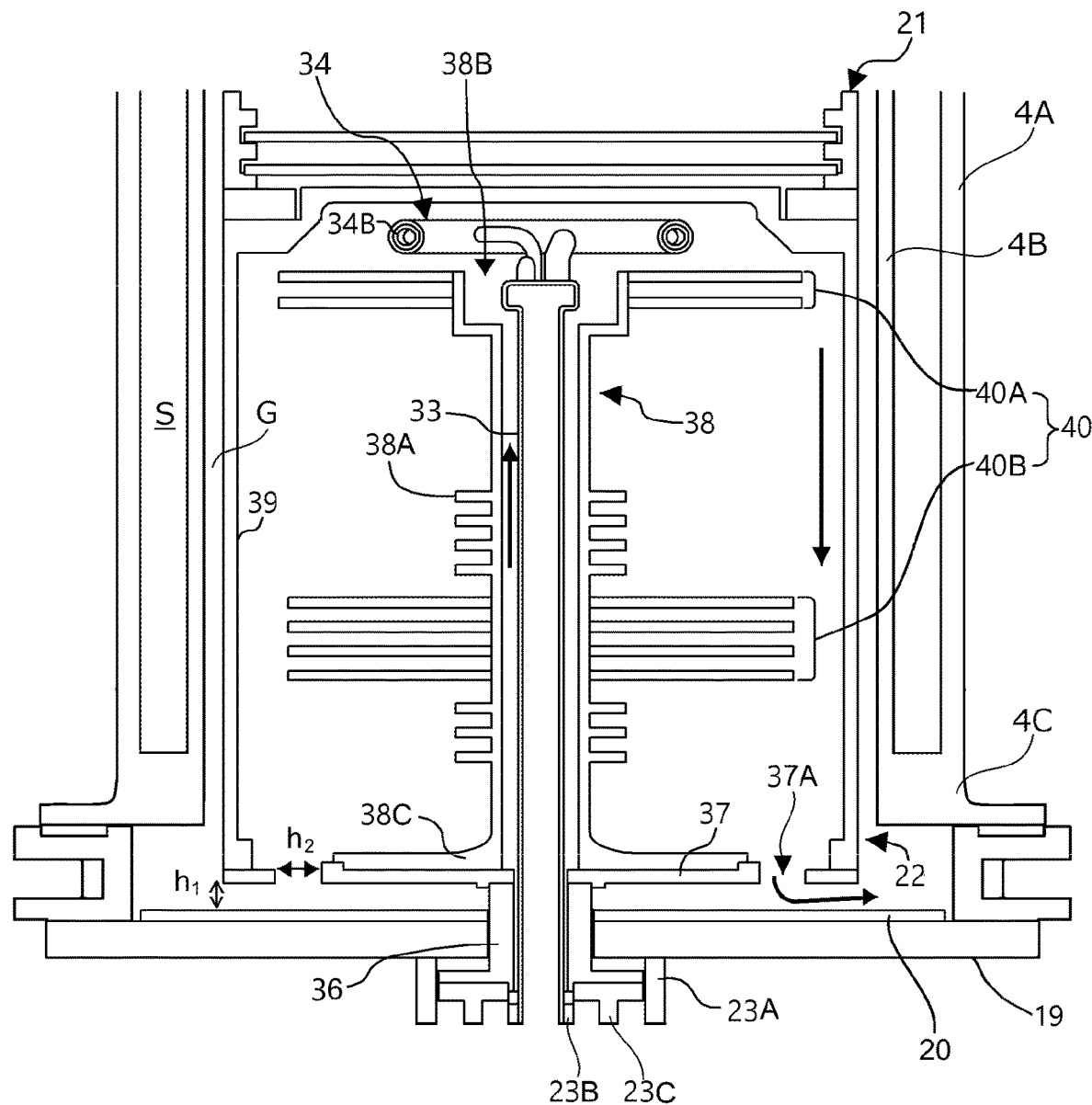
FIG. 2 schematically illustrates a vertical cross-section of a heat insulating assembly of the substrate processing apparatus according to the embodiments described herein.

FIG. 2 schematically illustrates a vertical cross-section of the heat insulating assembly 22. The heat insulating assembly 22 is constituted by a rotating table 37, a heat insulator retainer 38, a cylindrical portion 39 and a heat insulator 40. The rotating table 37 serves as a bottom plate (that is, a support plate).

The rotating table 37 is of a disk shape. A through-hole through which a sub heater column 33 penetrates the rotating table 37 is provided at a center of the rotating table 37. The rotating table 37 is placed on an upper end of a rotating shaft 36, and is fixed to the cover plate 20 with a predetermined distance (gap) h1 therebetween. A plurality of exhaust holes 37A with a diameter (width) h2 is provided at the rotating table 37 in a rotationally symmetrical arrangement in the vicinity of an edge of the rotating table 37. The heat insulator retainer 38 and the cylindrical portion 39 are placed concentrically on an upper surface of the rotating table 37 and fixed by components such as screws. The heat insulator retainer 38 is configured to support the heat insulator 40.

The heat insulator retainer 38 is of a cylindrical shape. A cavity through which the sub heater column 33 penetrates the heat insulator retainer 38 is provided at a center of the heat insulator retainer 38. A flow path, whose cross-section is of annular shape, configured to supply the shaft purge gas upward in the heat insulating assembly 22 is provided between an inner periphery of the heat insulator retainer 38 and the sub heater column 33. The heat insulator retainer 38 is provided with a pedestal 38C of an outward-extending flange shape at a lower end of the heat insulator retainer 38. An outer diameter of the pedestal 38C is smaller than a diameter of the rotating table 37. An upper end of the heat insulator retainer 38 is configured as a supply port 38B of the purge gas. An upper end portion of the supply port 38B expands in diameter so as to accommodate the sub heater column 33 protruding outward near the upper end portion of the supply port 38B.

A plurality of reflecting plates 40A and a plurality of heat insulating plates 40B serving as the heat insulator 40 are coaxially arranged on a column of the heat insulator retainer 38.

An outer diameter of the cylindrical portion 39 is set such that a gap G between the inner tube 4B and the cylindrical portion 39 becomes a predetermined distance. The plurality of the heat insulating plates 40B is provided on the column of the heat insulator retainer 38 at positions (heights) corresponding to the plurality of the sub exhaust ports 4G. A cavity in which neither the plurality of the reflecting plates 40A nor the plurality of the heat insulating plates 40B is disposed is provided above the plurality of the heat insulating plates 40B. As a result, with the plurality of the sub exhaust ports 4G as a boundary, it is possible to maintain upper portions (that is, above the boundary) of components such as the heat insulating assembly 22 and the inner tube 4B at a high temperature and lower portions (that is, below the boundary) of the components such as the heat insulating assembly 22 and the inner tube 4B at a low temperature. Thereby, it helps to prevent by-products from adhering to components such as the inner tube 4B in the gap G above the plurality of the sub exhaust ports 4G where the purging effect by the purge gas is weak. For example, a vapor pressure of ammonium chloride which is one of the by-products is about 1000 Pa at 200° C. However, at temperatures lower than 200° C., the vapor pressure of the ammonium chloride decreases and the ammonium chloride condenses easily. Therefore, it is preferable that the temperature of the ammonium chloride is maintained higher than 200° C. or the ammonium chloride is purged by the purge gas. In a process performed at a medium or low temperature of 500° C. or lower, the plurality of the sub exhaust ports 4G is preferably disposed at the positions (heights) of the plurality of the sub exhaust ports 4G shown in FIG. 3. However, in a process performed at a temperature higher than 500° C., the plurality of heat insulating plates 40B may be installed on a plurality of plate supports 38A provided on the column of the heat insulator retainer 38 in order to insulate a space between the boat 21 and the lid 19 throughout the entire heat insulating assembly 22. It is preferable that the gap G is narrow in order to suppress the process gas and the shaft purge gas from passing therethrough. For example, the gap G preferably ranges from 7.5 mm to 15 mm. An upper end of the cylindrical portion 39 is closed by a flat plate, and the boat 21 is installed on the flat plate.

A casing (also referred to as a "body") 23A of the rotating mechanism 23 is airtightly fixed to a lower surface of the lid 19. From an inside of the casing 23A, an inner shaft 23B of a cylindrical shape and an outer shaft 23C of a cylindrical shape are arranged in this order coaxially in the casing 23A. A diameter of the outer shaft 23C is greater than that of the inner shaft 23B. The outer shaft 23C coupled to the rotating shaft 36 may be rotatably supported by bearings (not shown) interposed between the outer shaft 23C and the casing 23A. The inner shaft 23B coupled to the sub heater column 33 is fixed to the casing 23A so that it cannot rotate.

A sub heater column 33 is vertically inserted inside the inner shaft 23B. For example, the sub heater column 33 is a quartz pipe configured to support the cap heater 34 concentrically at an upper end thereof. The cap heater 34 is configured by forming a circular tube in an annular shape, and a heating wire coil 34B is accommodated in an inside of the cap heater 34 isolated from an outside of the cap heater 34. The heating wire coil 34B and a lead wire (not shown) of a temperature sensor (not shown) associated with the heating wire coil 34B are taken out of the lid 19 through the sub heater column 33.

The shaft purge gas introduced into the casing 23A by the gas supply pipe 24 flows upward on an inner side and an outer side of the rotating shaft 36. The purge gas supplied into the inner side the rotating shaft 36 flows upward along a flow path between the heat insulator retainer 38 and the sub heater column 33. After the purge gas is ejected through the supply port 38B, the purge gas flows downward in a space between the heat insulator retainer 38 and an inner wall of the cylindrical portion 39, and is exhausted out of the heat insulating assembly 22 through the plurality of the exhaust holes 37A. The purge gas supplied into the outer side the rotating shaft 36 flows between the rotating shaft 36 and the cover plate 20 while diffusing in a radial direction, and then joins the purge gas exhausted through the plurality of the exhaust holes 37A to thereby purge the furnace opening portion.

Figure 3:
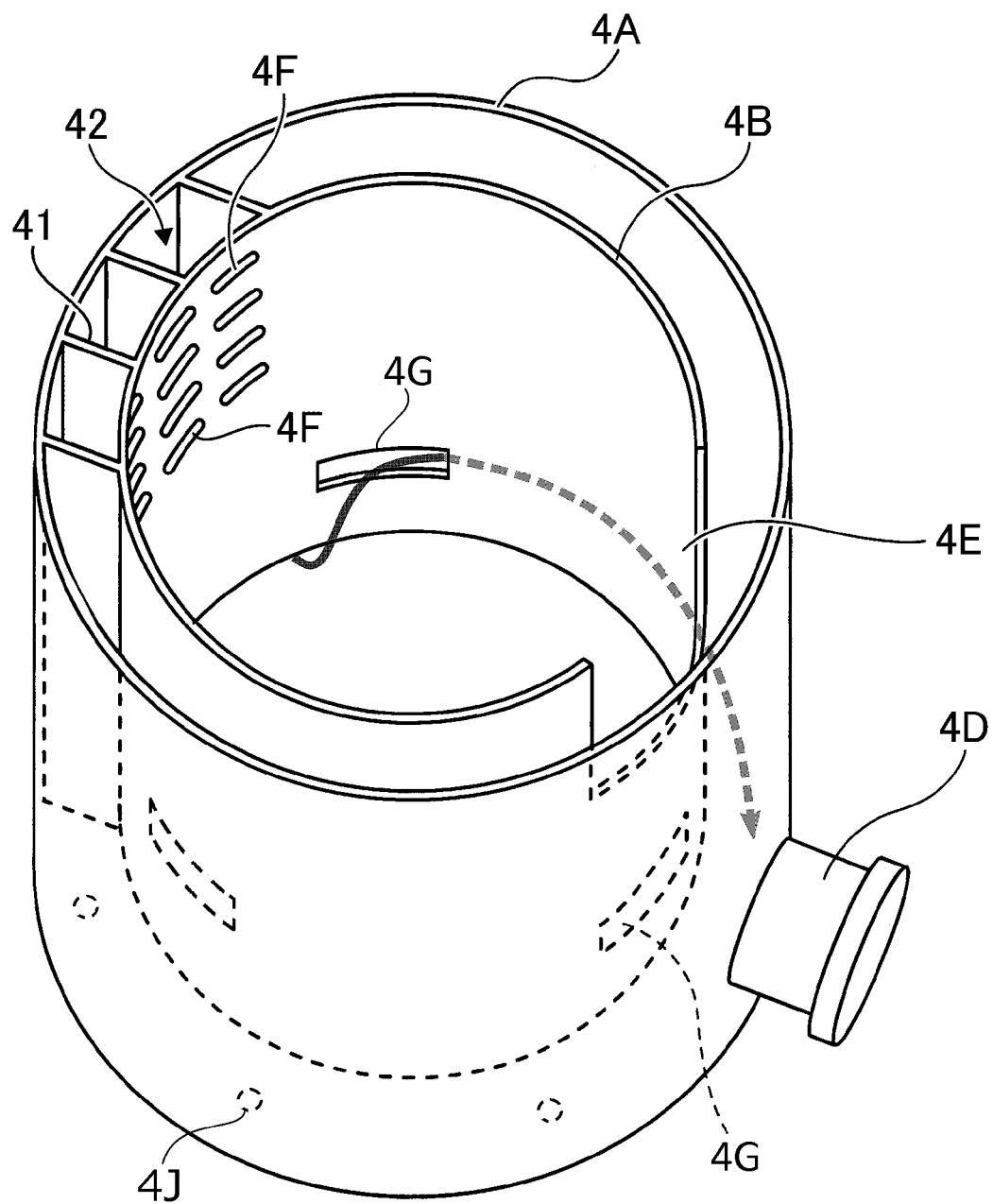
FIG. 3 is a perspective view schematically illustrating a reaction tube of the substrate processing apparatus according to the embodiments described herein.

FIG. 3 is a perspective view schematically illustrating the reaction tube 4 cut horizontally. In the inner tube 4B is provided a plurality of supply slits 4F configured to supply the process gas into the process chamber 6. The supply slits 4F are arranged in a lattice pattern. That is, for example, the number of the supply slits 4F counted along the vertical direction (that is, the number of columns of the lattice pattern) is the same as the number of the wafers including the wafer 7, and the number of the supply slits 4F counted along the horizontal direction (that is, the number of rows of the lattice pattern) is three. A plurality of partition plates 41 extending in the vertical direction is provided so as to partition the exhaust space S between the outer tube 4A and the inner tube 4B. The partition plates 41 are arranged circumferentially between the supply slits 4F or at both the ends of the supply slits 4F. Sections separated from the exhaust space S by the plurality of the partition plates 41 constitutes the plurality of the nozzle chambers (also referred to as a "nozzle buffer") 42. As a result, the horizontal cross-section of the exhaust space S is of a C shape. In the vicinity of the substrate processing region A, only the plurality of the supply slits 4F directly communicates with the plurality of the nozzle chambers (for example, three nozzle chambers) 42 and the inside of the inner tube 4B.

The plurality of the partition plates 41 is connected to the inner tube 4B. However, in order to avoid the stress caused by a temperature difference between the outer tube 4A and the inner tube 4B, the plurality of the partition plates 41 may not to be directly connected to the outer tube 4A, and a slight gap may be provided between the plurality of the partition plates 41 and the outer tube 4A. The plurality of the nozzle chambers 42 does not need to be completely isolated from the exhaust space S. One or more openings or gaps communicating with the exhaust space S and the plurality of the nozzle chambers 42 may be provided at the plurality of the nozzle chambers 42, particularly at upper ends and lower ends of the plurality of the nozzle chambers 42. Outer peripheral sides of the plurality of the nozzle chambers 42 may be partitioned by the outer tube 4A. However, the configuration of the nozzle chambers 42 is not limited thereto. For example, a partition plate extending along an inner surface of the outer tube 4A may be separately provided to constitute the outer boundary of the nozzle chambers 42.

In the inner tube 4B, the plurality of the sub exhaust ports (for example, three sub exhaust ports) 4G is provided at such positions as to open toward a side surface of the heat insulating assembly 22. One of the three sub exhaust ports 4G is oriented in the same direction as the exhaust outlet 4D, and is disposed at a height such that at least a part of an opening thereof overlaps a pipe of the exhaust outlet 4D. In addition, the remaining two sub exhaust ports 4G are arranged in the vicinity of both side portions of the plurality of the nozzle chambers 42. Alternatively, the three sub exhaust ports 4G may be arranged at positions that are spaced apart by 180 degrees on a circumference of the inner tube 4B.

As shown in FIG. 4, the nozzles 8a through 8c are installed in the three nozzle chambers 42, respectively. The plurality of the nozzle holes 8H opened toward the center of the reaction tube 4 is provided on the side surfaces of the nozzles 8a through 8d, respectively. The gas ejected through the plurality of the nozzle holes 8H is intended to flow from the plurality of supply slits 4F into the inner tube 4B, but a part of the gas may not flow directly into the inner tube 4B.

As shown in FIG. 1, the gas supply pipes 9a, 9b and 9c through the valves 14a, 14b and 14c of the gas supply system are connected to the nozzles 8a through 8c, respectively. It is possible to supply different gases to the nozzles 8a through 8c using the gas supply system. Since the nozzles 8a through 8c are installed in independent spaces separated by the plurality of the partition plates 41, it is possible to prevent the process gas supplied through the nozzles 8a through 8c from being mixed in the plurality of the nozzle chambers 42. It is also possible to discharge the stagnated gas in the plurality of the nozzle chambers 42 through the upper ends and the lower ends of the plurality of the nozzle chambers 42 to the exhaust space S. With the configuration described above, it is possible to prevent the process gas from being mixed in the plurality of the nozzle chambers 42 to form a film or to generate the by-products. Only in FIG. 4 is shown the nozzle (also referred to as a "purge nozzle") 8d that can be installed as desired in the exhaust space S adjacent to the plurality of the nozzle chambers 42 along an axial direction (vertical direction) of the reaction tube 4.

Figure 5:
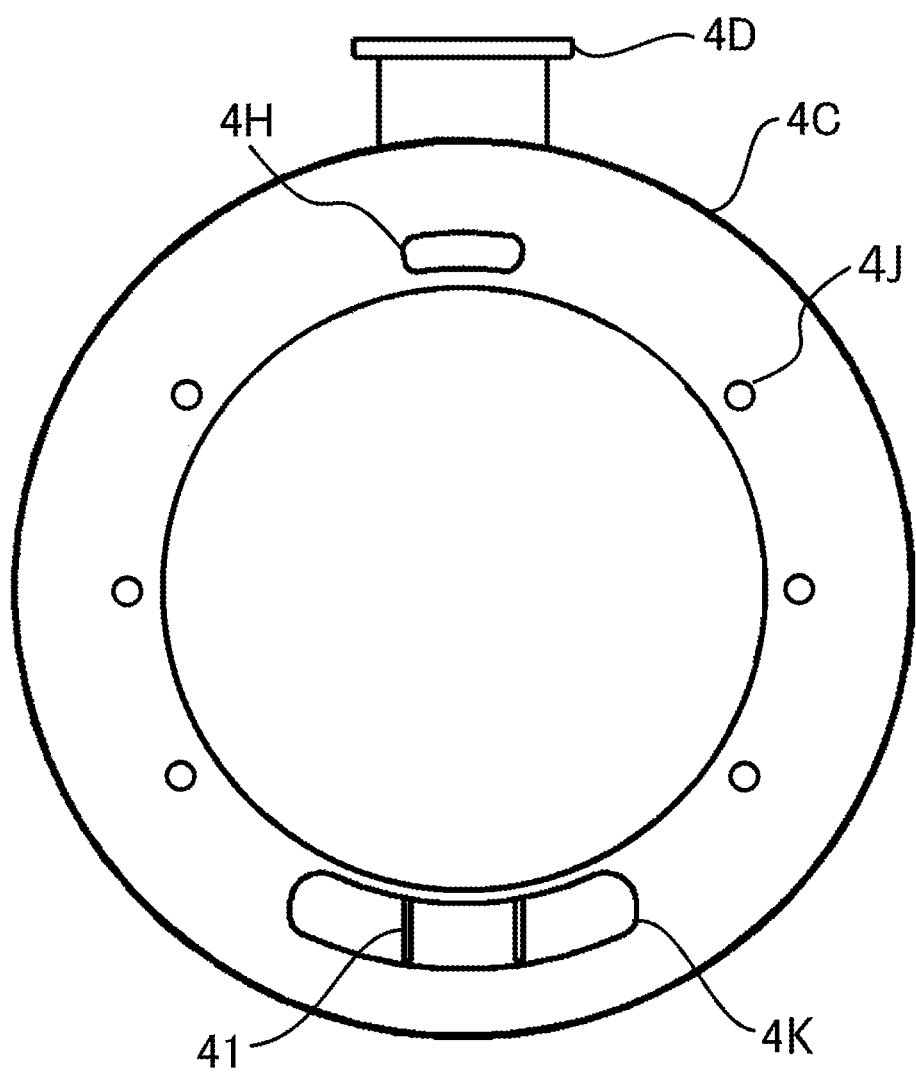
FIG. 5 is a bottom view schematically illustrating the reaction tube of the substrate processing apparatus according to the embodiments described herein.

FIG. 5 is a bottom view schematically illustrating the reaction tube 4. As described above, the flange portion 4C is provided with the bottom exhaust port 4H, the plurality of the bottom exhaust ports 4J and the nozzle introduction hole 4K serving as openings that connect the exhaust space S and a lower portion of the flange portion 4C. The bottom exhaust port 4H is a long hole provided at a location closest to the exhaust outlet 4D, and each of the plurality of the bottom exhaust ports 4J is a small hole. For example, the plurality of the bottom exhaust ports (for example, six bottom exhaust ports) 4J is provided at six locations along the exhaust space S of a C shape. The nozzles 8a through 8c are inserted into the nozzle introduction hole 4K through an opening of the nozzle introduction hole 4K. As shown in FIG. 1, the nozzles 8a through 8c may be closed by a nozzle introduction hole cover 8S. For example, the nozzle introduction hole cover 8S is made of quartz. When an opening of each of the plurality of the bottom exhaust ports 4J is too large as will be described later, a flow velocity of the shaft purge gas passing therethrough may decrease, and the gas such as the source gas may enter the furnace opening portion from the exhaust space S by diffusion. Therefore, each of the plurality of the bottom exhaust ports 4J may be configured as a hole with a reduced diameter at a center thereof (that is, a constricted hole).

Figure 6:
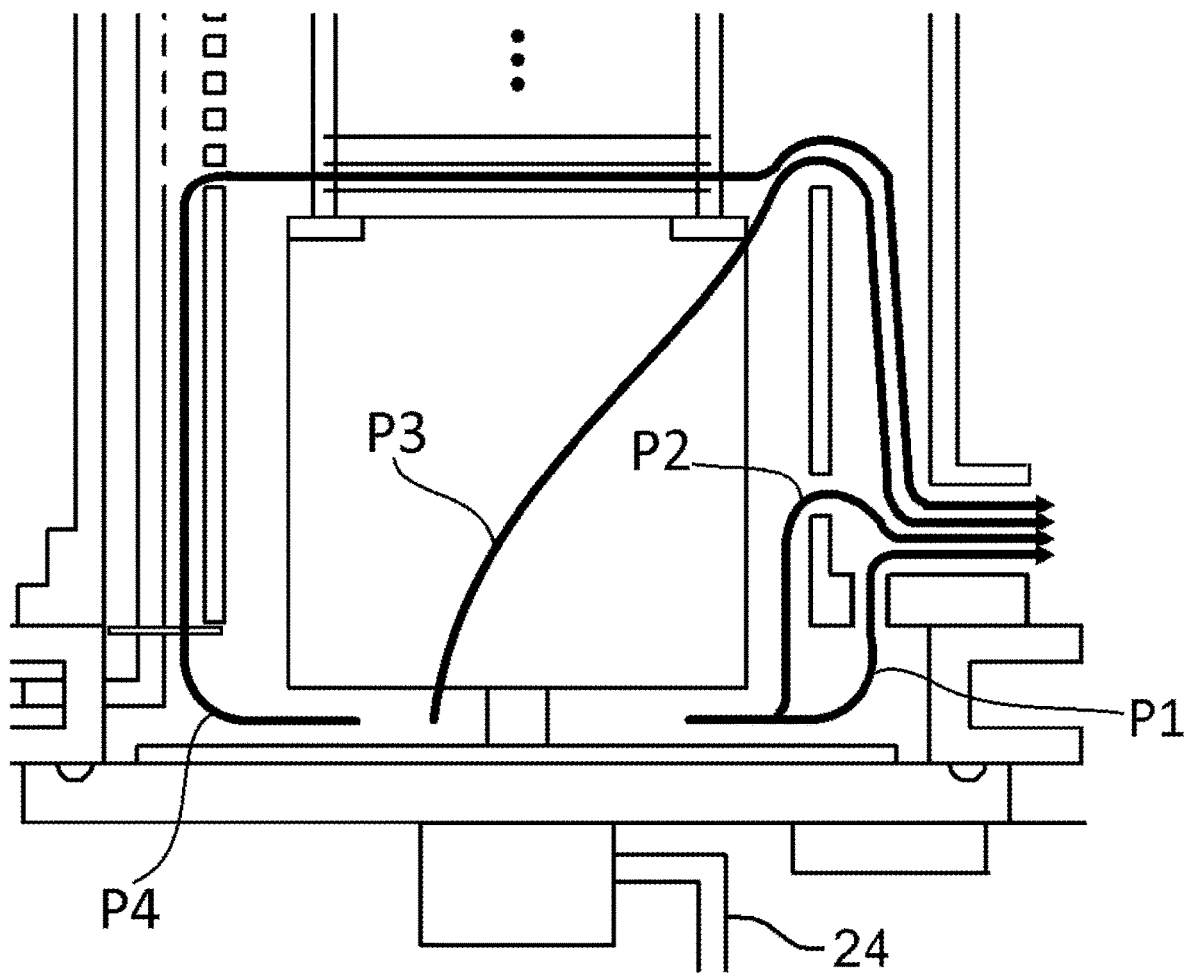
FIG. 6 schematically illustrates a flow of a shaft purge gas in the substrate processing apparatus according to the embodiments described herein.

FIG. 6 schematically illustrates discharge paths of the shaft purge gas. The shaft purge gas supplied through the gas supply pipe 24 flows in a radial direction through the gap h1 between the rotating table 37 and the cover plate 20 while forming a diffusion barrier, and is discharged to the furnace opening portion. At the furnace opening portion, the purge gas suppresses the flow of the source gas into the furnace opening portion, dilutes the source gas that has entered the furnace opening portion by diffusion, and discharges the source gas with the flow of the purge gas. As a result, it is possible to prevent the by-products from adhering to the furnace opening portion or from deteriorating. For example, there are four discharge paths of the shaft purge gas as follows.

Path P1: the shaft purge gas enters the exhaust space S through the bottom exhaust port 4H or the plurality of the bottom exhaust ports 4J, and reaches the exhaust outlet 4D.

Path P2: the shaft purge gas passes through the gap G between the inner tube 4B and the heat insulating assembly 22, enters the exhaust space S through the plurality of the sub exhaust ports 4G, and reaches the exhaust outlet 4D.

Path P3: the shaft purge gas enters the substrate processing region A through the gap G between the inner tube 4B and the heat insulating assembly 22, enters the exhaust space S through the main exhaust port 4E, and reaches the exhaust outlet 4D.

Path P4: the shaft purge gas enters the plurality of the nozzle chambers 42 through the nozzle introduction hole 4K, crosses the substrate processing region A, enters the exhaust space S through the main exhaust port 4E, and reaches the exhaust outlet 4D.

The paths P3 and P4 through which the purge gas (that is, the shaft purge gas) flows into the substrate processing region A are not desirable for processing the substrate (that is, the wafer 7) because a concentration of the process gas may decrease below the substrate processing region A so that an uniformity among the substrates (that is, the plurality of wafers including the wafer 7) may be lowered. In particular, the reaction tube 4 of the embodiments has a feature that a pressure loss of the main exhaust port 4E is small, so that the purge gas may be easily drawn into the paths P3 and P4. If neither the nozzle introduction hole cover 8S nor the plurality of the bottom exhaust ports 4J is provided, the purge gas would flow exclusively through the path P4. Therefore, according to the embodiments, by enlarging an opening of each of the plurality of the sub exhaust ports 4G and by reducing the gap G, the purge gas flows more easily through the path P2 than through the path P3. In addition, by adjusting the opening of the nozzle introduction hole 4K to be substantially small, for example, by closing the nozzle introduction hole 4K by the nozzle introduction hole cover 8S, it is difficult for the purge gas to flow through the path P4. When the process gas and the shaft purge gas are allowed to flow, a preferred pressure gradient is formed on a side surface of the cylindrical portion 39 due to the plurality of the sub exhaust ports 4G. That is, on the side surface of the cylindrical portion 39 when the process gas and the shaft purge gas are flowing, according to the preferred pressure gradient, the pressure is high near a substrate processing region A and near a furnace opening portion, and the pressure is the lowest in the vicinity of the plurality of the sub exhaust ports 4G. According to the preferred pressure gradient, it is possible to suppress both the flow of the shaft purge gas into the substrate processing region A by the path P3 and the flow (diffusion) of the process gas into the furnace opening portion. When the supply of the shaft purge gas is excessive, a pressure loss in the paths P1 and P2 may increase, and the pressure gradient may be deteriorated.

The process gas such as a cleaning gas tends to stagnate at an innermost portion of the exhaust space S of a C shape since the innermost portion of the exhaust space S is in contact with and closed by the plurality of the nozzle chambers 42. However, the process gas can be circulated in the exhaust space S and the furnace opening portion by the plurality of the bottom exhaust ports 4J. When an amount of the shaft purge gas is large (that is, the pressure near the furnace opening portion is high), the shaft purge gas enters into the exhaust space S through the path P3 to eliminate the stagnation of the process gas. Conversely, when the amount of the shaft purge gas is small, the process gas flows into or diffuses into the exhaust space S and is discharged through the bottom exhaust port 4H. In both cases, it contributes to the exhaust of the stagnated gas in the exhaust space S. In addition, when an amount of the stagnated gas in the exhaust space S is very small, there is no problem because the stagnated gas in the exhaust space S is sufficiently diluted even if it enters the furnace opening portion.

However, when each of the plurality of the bottom exhaust ports 4J is increased in size and a conductance of the path of P1 is increased too much, a maximum flow velocity of the shaft purge gas decreases in all paths including P1, and the process gas may easily enter the furnace opening portion by diffusion in a direction against the flow thereof.

In summary, it is preferable that a conductance of the path P4 and a conductance of the path P3 are set to be lower than both of the conductance of the path P1 and a conductance of the path P2, and that upper limits of the conductance of the path P1 and the conductance of the path P2 are set such that the amount of the process gas enters into the furnace opening portion is below an allowable amount.

Figure 7:
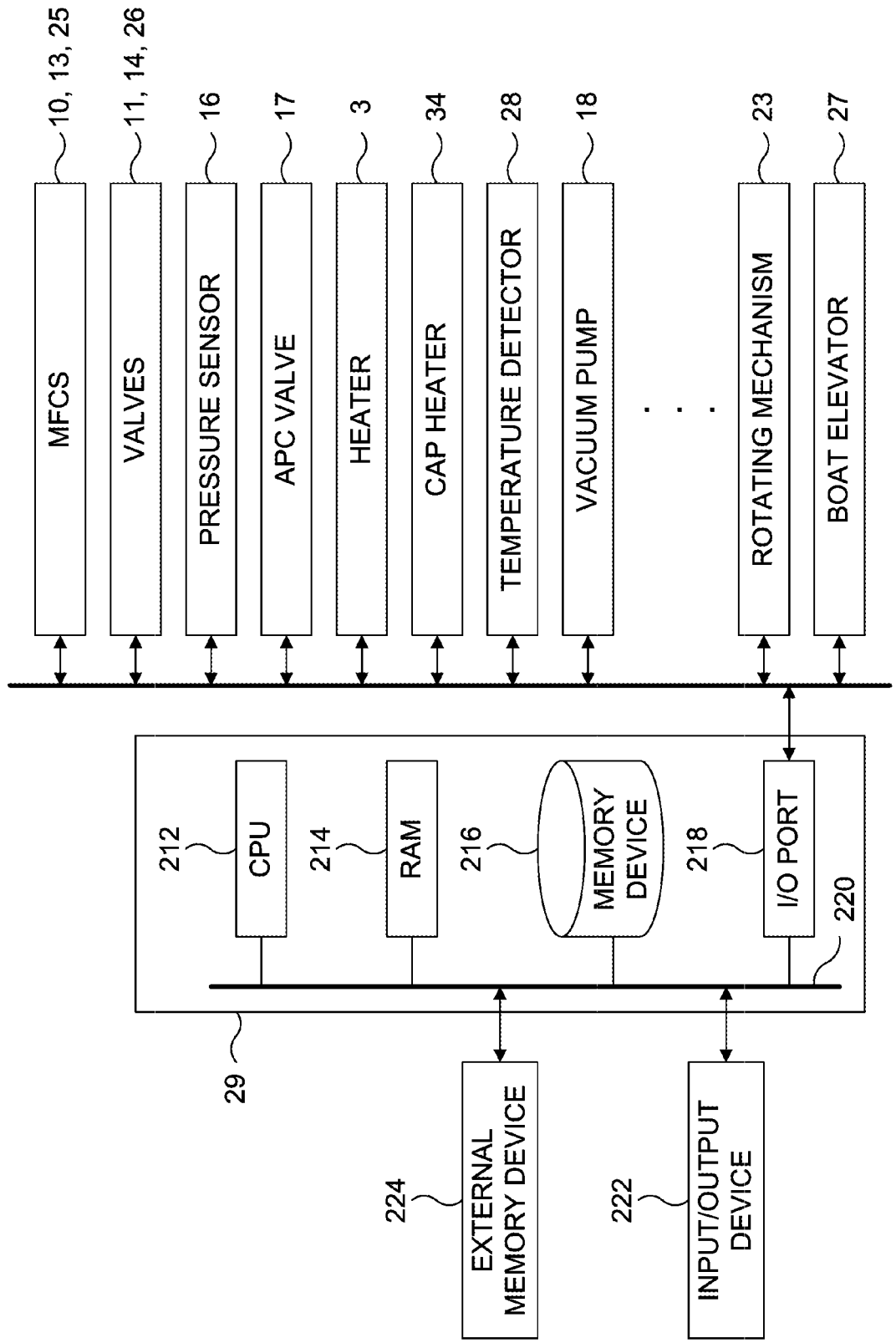
FIG. 7 is a block diagram schematically illustrating a configuration of a controller and related components of the substrate processing apparatus according to the embodiments described herein.

As shown in FIG. 7, as described above, the controller 29 is electrically connected to the components of the substrate processing apparatus 1 such as the MFCs 10, 13 and 25, the valves 11, 14 and 26, the pressure sensor 16, the APC valve 17, the vacuum pump 18, the heater 3, the cap heater 34, the temperature detector 28, the rotating mechanism 23 and the boat elevator 27, and is configured to control the components electrically connected thereto. The controller 29 is constituted by a computer including a CPU (Central Processing Unit) 212, a RAM (Random Access Memory) 214, a memory device 216 and an I/O port 218. The RAM 214, the memory device 216 and the I/O port 218 may exchange data with the CPU 212 through an internal bus 220. The I/O port 218 is connected to the components described above. For example, an input/output device 222 such as a touch panel is connected to the controller 29.

The memory device 216 is configured by components such as a flash memory and a hard disk drive (HDD). For example, a control program for controlling the operation of the substrate processing apparatus 1 or a program (for example, a recipe such as a process recipe and a cleaning recipe) configured to control the components of the substrate processing apparatus 1 according to the process conditions to perform a substrate processing such as a film-forming process is readably stored in the memory device 216. The RAM 214 functions as a memory area (work area) where a program or data read by the CPU 212 is temporarily stored.

The CPU 212 is configured to read the control program from the memory device 216 and execute the read control program. In addition, the CPU 212 is configured to read the recipe from the memory device 216 according to an operation command inputted from the input/output device 222. According to the contents of the read recipe, the CPU 212 is configured to control the components of the substrate processing apparatus 1.

The controller 29 may be embodied by installing the above-described program stored in an external memory device 224 in a non-transitory manner into a computer. For example, the external memory device 224 may include a semiconductor memory such as a USB memory and a memory card, an optical disk such as a CD and a DVD and a hard disk drive (HDD). The memory device 216 or the external memory device 224 may be embodied by a non-transitory tangible computer readable recording medium. Hereafter, the memory device 216 and the external memory device 224 are collectively referred to as "recording media". Instead of the external memory device 224, a communication means such as the Internet and a dedicated line may be used for providing the program to the computer.

Hereinafter, an exemplary sequence of the substrate processing (film-forming process) of forming a film on the substrate (that is, the wafer 7), which is a part of manufacturing processes of a semiconductor device, will be described. The exemplary sequence of the substrate processing is performed using the substrate processing apparatus 1.

The exemplary sequence of the substrate processing will be described by way of an example in which a silicon nitride film (SiN film) is formed on the wafer 7 serving as the substrate by respectively supplying hexachlorodisilane (HCDS) gas serving as a first process gas (also referred to as the "source gas") to the wafer 7 through the nozzle 8a and ammonia (NH₃) gas serving a second process gas (also referred to as a "reactive gas") to the wafer 7 through the nozzle 8b. In the following descriptions, the operations of the components constituting the substrate processing apparatus 1 are controlled by the controller 29.

According to the exemplary sequence of the substrate processing (that is, the film-forming process) of the embodiments, the SiN film is formed on the wafer 7 by performing (repeating) a cycle a predetermined number of times (at least once). For example, the cycle may include: supplying the HCDS gas to the wafer 7 in the process chamber 6; removing the HCDS gas (residual gas) from the process chamber 6; supplying the NH₃ gas to the wafer 7 in the process chamber 6; and removing the NH₃ gas (residual gas) from the process chamber 6. The steps of the cycle are non-simultaneously performed. In the present specification, the exemplary sequence of the film-forming process according to the embodiments may be represented as follows:

(HCDS→NH₃)×n=>SiN

<Wafer Charging and Boat Loading Step>

The plurality of the wafers including the wafer 7 is charged (transferred) into the boat 21 (wafer charging step). After the boat 21 is charged with the plurality of the wafers, the boat 21 charged with the plurality of the wafers is elevated by the boat elevator 27 and loaded (transferred) into the process chamber 6 (boat loading step). With the boat 21 loaded, the lid 19 seals the lower end opening of the manifold 5 via the O-ring 19A. From a standby state before the wafer charging step, the valves 14a and 14b may be opened to supply a small amount of the purge gas into the cylindrical portion 39.

<Pressure Adjusting Step>

The vacuum pump 18 exhausts (vacuum-exhausts) the inner atmosphere of the process chamber 6 until the inner pressure of the process chamber 6 in which the plurality of the wafers including the wafer 7 is accommodated reaches a desired pressure (vacuum degree). In the pressure adjusting step, the inner pressure of the process chamber 6 is measured by the pressure sensor 16, and the APC valve 17 is feedback-controlled based on the measured pressure. The purge gas is continuously supplied into the cylindrical portion 39 and the inner atmosphere of the process chamber 6 is continuously exhausted by the vacuum pump 18 until at least the processing of the wafer 7 is completed.

<Temperature Elevating Step>

After the inner atmosphere (for example, oxygen) of the process chamber 6 is sufficiently exhausted from the process chamber 6, the inner temperature of the process chamber 6 is elevated. The states of the electric conduction to the heater 3 and the cap heater 34 are feedback-controlled based on the temperature detected by the temperature detector 28 such that the inner temperature of the process chamber 6 has a desired temperature distribution suitable for performing a film-forming step described later. The heater 3 and the cap heater 34 continuously heat the process chamber 6 until at least the processing (the film-forming process) of the wafer 7 is completed. The time duration of supplying the electrical power to the cap heater 34 may not be equal to the time duration of supplying the electrical power to the heater 3. Immediately before the start of the film-forming step, it is preferable that a temperature of the cap heater 34 reaches the same temperature as a film-forming temperature, and an inner surface temperature of the manifold 5 reaches 180° C. or higher (for example, 260° C.).

In addition, the boat 21 and the plurality of the wafers including the wafer 7 are rotated by the rotating mechanism 23. The boat 21 is rotated by the rotating mechanism 23 via the rotating shaft 36, the rotating table 37, and the cylindrical portion 39. Therefore, it is possible to rotate the plurality of the wafers including the wafer 7 without rotating the cap heater 34. As a result, uneven heating is reduced. As a result, it is possible to uniformly heat the plurality of the wafers. The rotating mechanism 23 continuously rotates the boat 21 and the plurality of the wafers until at least the processing of the wafer 7 is completed.

<Film-Forming Step>

After the inner temperature of the process chamber 6 is stabilized at a predetermined processing temperature, the film-forming step is performed by performing (repeating) a first step through a fourth step described below sequentially. In addition, before starting the first step, the valve 26 may be opened to increase the supply of the purge gas.

<First Step: Source Gas Supply Step>

In the first step, the HCDS gas is supplied to the wafer 7 in the process chamber 6. By opening of the valve 11b and the valve 14a, the HCDS gas is supplied into the gas supply pipe 9b and the N₂ gas is supplied into the gas supply pipe 12a. The flow rates of the HCDS gas and the N₂ gas are adjusted by the MFCs 10b and 13a, respectively. The HCDS gas and the N₂ gas with the flow rate thereof adjusted respectively are supplied to the wafer 7 in the process chamber 6 through the nozzle 8b and 8a, and are exhausted through the exhaust pipe 15. By supplying the HCDS gas to the wafer 7 in the process chamber 6, a silicon-containing layer having a thickness of, for example, less than one atomic layer to several atomic layers is formed as a first layer on an outermost surface of the wafer 7.

<Second Step: Source Gas Exhaust Step>

After the first layer is formed, the valve 11a is closed to stop the supply of the HCDS gas into the process chamber 6. In the second step, by maintaining the APC valve 17 open, the vacuum pump 18 vacuum-exhausts the inner atmosphere of the process chamber 6 to remove the HCDS gas remaining in the process chamber 6 which did not react or which contributed to the formation of the first layer from the process chamber 6. In addition, by maintaining the valve 14a or the valve 14b open, the N₂ gas may be supplied to purge the gas supply pipe 9, the reaction tube 4 or the furnace opening portion.

<Third Step: Reactive Gas Supply Step>

In the third step, the NH₃ gas is supplied to the wafer 7 in the process chamber 6. The valves 11a and 14b are controlled in the same manner as the valves 11b and 14a in the first step. The flow rates of the NH₃ gas and the N₂ gas are adjusted by the MFCs 10a and 13b, respectively. The NH₃ gas and the N₂ gas with the flow rate thereof adjusted respectively are supplied to the wafer 7 in the process chamber 6 through the nozzle 8b and 8a, and are exhausted through the exhaust pipe 15. The NH₃ gas supplied to the wafer 7 reacts with at least a portion of the first layer (that is, the silicon-containing layer) formed on the wafer 7 in the first step. As a result, the first layer is modified (nitrided) into a second layer containing silicon (Si) and nitrogen (N), that is, a silicon nitride layer (SiN layer).

<Fourth Step: Reactive Gas Exhaust Step>

After the second layer is formed, the valve 11a is closed to stop the supply of the $NH_3$ gas into the process chamber 6. Similar to the second step, the vacuum pump 18 vacuum-exhausts the inner atmosphere of the process chamber 6 to remove the by-products or the $NH_3$ gas remaining in the process chamber 6 which did not react or which contributed to the formation of the second layer from the process chamber 6.

By performing the cycle wherein the first step through the fourth step described above are performed non-simultaneously (without overlapping) in order a predetermined number of times (n times), the SiN film having a predetermined composition and a predetermined thickness is formed on the wafer 7.

For example, the process conditions for the exemplary sequence of the substrate processing are as follows:

Processing Temperature (wafer temperature): 250° C. to 700° C.;

Processing Pressure (the inner pressure of the process chamber): 10 Pa to 4,000 Pa;

Flow rate of the HCDS gas: 1 sccm to 2,000 sccm;

Flow rate of the $NH_3$ gas: 100 sccm to 10,000 sccm;

Flow rate of the $N_2$ gas (to the nozzles): 100 sccm to 10,000 sccm; and

Flow rate of the $N_2$ gas (to the rotating shaft): 100 sccm to 500 sccm

By selecting suitable values within these process conditions described above, it is possible to perform the substrate processing (film-forming process) properly.

A thermally decomposable gas such as the HCDS may form a film of the by-products on a surface of metal more easily than on a surface of quartz. The film of the by-products containing materials such as silicon oxide (SiO) and silicon oxynitride (SiON) may be easily adhered to a surface exposed to the HCDS gas (and the ammonia gas), particularly when the temperature of the surface is 260° C. or lower.

<Purging and Returning to Atmospheric Pressure Step>

After the film-forming step is completed, by opening the valves 14a and 14b, the $N_2$ gas is supplied into the process chamber 6 through each of the gas supply pipes 12a and 12b, and then the $N_2$ gas supplied into the process chamber 6 is exhausted through the exhaust pipe 15. The inner atmosphere of the process chamber 6 is replaced with the $N_2$ gas (that is, the inert gas) (substitution by inert gas), and thus the gas such as the source gas remaining in the process chamber 6 or the reaction by-products remaining in the process chamber 6 are removed (purged) from the process chamber 6 (purging step). Thereafter, the APC valve 17 is closed, and the $N_2$ gas is filled in the process chamber 6 until the inner pressure of the process chamber 6 reaches a normal pressure (returning to atmospheric pressure step).

<Boat Unloading and Wafer Discharging Step>

Thereafter, the lid 19 is lowered by the boat elevator 27 and the lower end of the manifold 5 is opened. The boat 21 with the processed wafers including the wafer 7 charged therein is unloaded out of the reaction tube 4 through the lower end of the manifold 5 (boat unloading step). Then, the processed wafers including the wafer 7 are transferred (discharged) from the boat 21 (wafer discharging step).

When the film-forming process described above is performed, a film nitrogen may be formed on heated surfaces of components (members) in the reaction tube 4 by depositing deposits such as the SiN film containing nitrogen. For example, the film may be formed on an inner wall of the outer tube 4A, a surface of the nozzle 8a, a surface of the inner tube 4B and a surface of the boat 21. Therefore, a cleaning process is performed when an amount of the deposits (that is, an accumulated thickness of the film formed on the heated surfaces of the components) reaches a predetermined amount (thickness) before the deposits are peeled off or fall off.

The cleaning process is performed by supplying, for example, $F_2$ gas serving as a fluorine-based gas into the reaction tube 4. Hereinafter, an example of the cleaning process according to the embodiments will be described with reference to FIGS. 8 and 11. In the following descriptions, the operations of the components constituting the substrate processing apparatus 1 are controlled by the controller 29.

<Substrate Processing Apparatus Providing Step: S100>

First, the substrate processing apparatus 1 described above is provided (prepared).

<Boat Loading Step: S110>

For example, the shutter (not shown) is moved to open the lower end opening of the manifold 5 (shutter opening step). Then, the boat 21 without accommodating the plurality of the wafers (hereinafter, also referred to as an "empty boat 21") is elevated by the boat elevator 27 and loaded (transferred) into the reaction tube 4 (boat loading step).

<Pressure and Temperature Adjusting Step: S120>

The vacuum pump 18 vacuum-exhausts the inner atmosphere of the reaction tube 4 such that an inner pressure of the reaction tube 4 reaches a desired pressure. The vacuum pump 18 continuously exhausts the inner atmosphere of the reaction tube 4 until at least the cleaning process is completed. The heater 3 heats the reaction tube 4 such that an inner temperature of the reaction tube 4 reaches a desired temperature (also referred to as a "second temperature"). For example, in order to prevent a temperature of an exhaust gas from excessively rising (elevating) in accordance with an etching reaction, the second temperature may be set lower than the temperature of the wafer 7 (also referred to as a "first temperature") in the film-forming step described above. In the pressure and temperature adjusting step S120, the boat 21 is rotated by the rotating mechanism 23. The rotating mechanism 23 may continuously rotate the boat 21 until at least the cleaning process is completed.

<Gas Cleaning Step: S130>

In a gas cleaning step (also referred to as a "cleaning gas supply step") S130, the valves 11b and 14a are controlled in the same manner as the valves 11b and 14a in the first step of the film-forming step. A flow rate of the $F_2$ gas serving as the cleaning gas is adjusted by the MFC 10b. The $F_2$ gas with the flow rate thereof adjusted is supplied into the reaction tube 4 through the gas supply pipe 9b and the nozzle 8b. By supplying the $N_2$ gas through the gas supply pipe 12b, it is possible to dilute the $F_2$ gas with the $N_2$ gas, and as a result, it is possible to control a concentration of the $F_2$ gas supplied into the reaction tube 4. In the gas cleaning step S130, a small amount of the $N_2$ gas may be supplied through the gas supply pipes 12a and 24 to purge the nozzle 8a, the shaft (that is, the rotating shaft 36) and the furnace opening portion. In addition, a gas such as hydrogen fluoride (HF) gas, hydrogen ($H_2$) gas and nitrogen monoxide (NO) gas may be added to the $F_2$ gas.

In the gas cleaning step S130, the APC valve 17 is appropriately controlled to adjust the inner pressure of the reaction tube 4 to a predetermined pressure. For example, the predetermined pressure of the reaction tube 4 may range from 1,330 Pa to 101,300 Pa, preferably, from 13,300 Pa to 53,320 Pa. The flow rate of the $F_2$ gas supplied into the reaction tube 4 is adjusted by the MFC 10a to a predetermined flow rate. For example, the predetermined flow rate of the $F_2$ gas may range from 100 sccm to 3,000 sccm. The flow rate of the $N_2$ gas supplied into the reaction tube 4 is adjusted by the MFC 13a to a predetermined flow rate. For example, the predetermined flow rate of the $N_2$ gas may range from 100 sccm to 10,000 sccm. For example, the time duration of supplying the $F_2$ gas into the reaction tube 4 (that is, a gas supply time of the $F_2$ gas), may be set to a predetermined time ranging from 60 seconds to 1,800 seconds, preferably, from 120 seconds to 1,200 seconds. The temperature of the heater 3 is adjusted (set) such that the inner temperature of the reaction tube 4 may become a predetermined temperature (also referred to as the "second temperature"). For example, the second temperature may range from 200° C. to 450° C., preferably, from 200° C. to 400° C.

When the inner temperature of the reaction tube 4 is less than 200° C., the etching reaction of the deposits may not easily proceed. Conversely, when the inner temperature of the reaction tube 4 is greater than 450° C., the etching reaction may become intense and the components (members) in the reaction tube 4 in the reaction tube 4 may be damaged.

Figure 8:
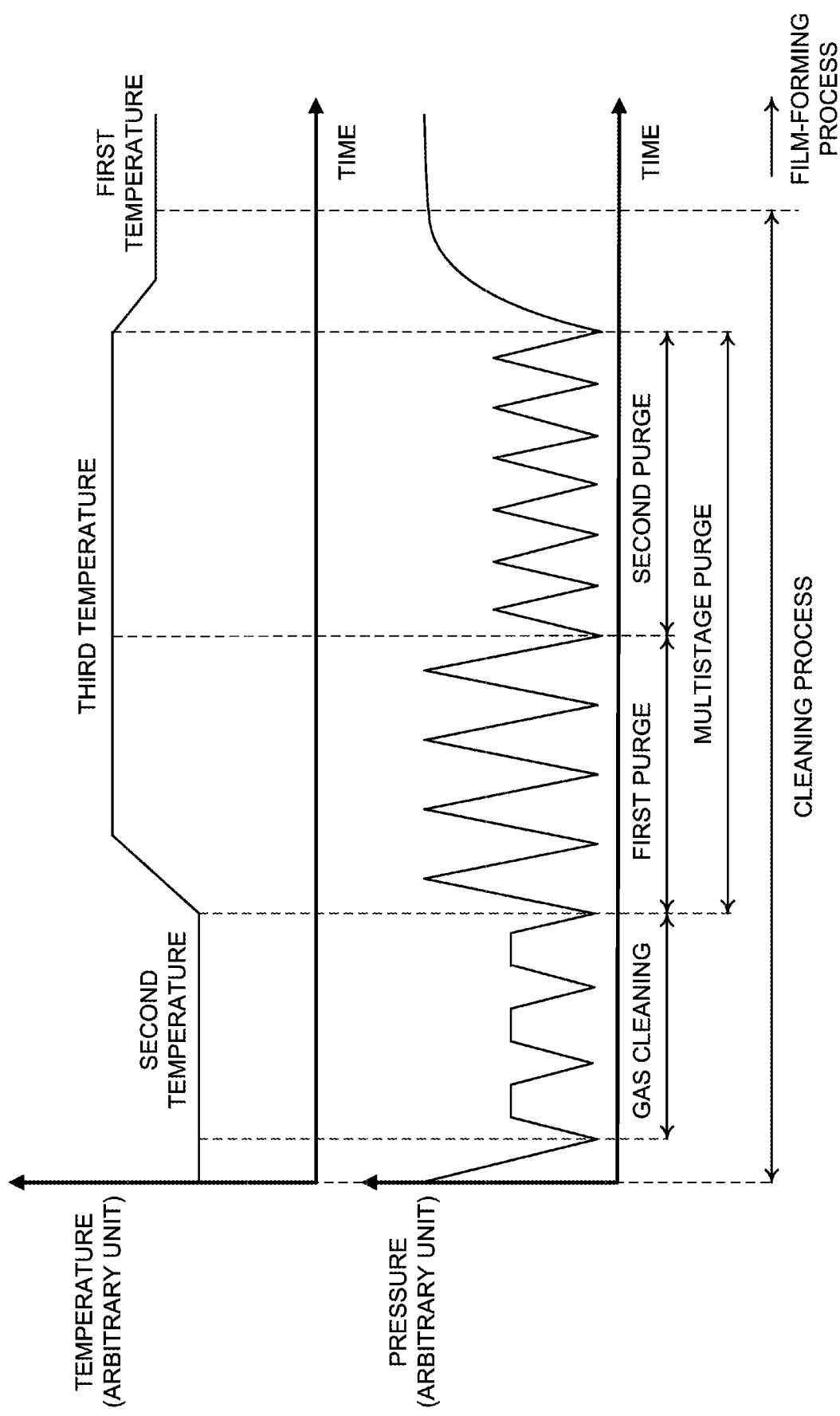
FIG. 8 schematically illustrates pressures and temperatures in a cleaning process according to the embodiments described herein.

The $F_2$ gas may be supplied into the reaction tube 4 continuously or intermittently. When the $F_2$ gas is supplied into the reaction tube 4 intermittently, the APC valve 17 may be closed to contain the $F_2$ gas in the reaction tube 4. By intermittently supplying the $F_2$ gas into the reaction tube 4, it is possible to generate (form) pressure fluctuations in the reaction tube 4, and as a result, the $F_2$ gas is diffused everywhere in the reaction tube 4 including each section of the plurality of the nozzle chambers 42. In addition, it is possible to control the amount of the by-products (or the grain size of the by-products) such as ammonium fluoride ($NH_4F$) and tetrafluorosilane ($SiF_4$) in the reaction tube 4 to prepare an environment in which the etching reaction easily proceeds. As a result, it is possible to suppress the amount of the $F_2$ gas used in the gas cleaning step S130, and it is also possible to reduce the cost of the cleaning process. FIG. 8 shows an example in which the $F_2$ gas is intermittently supplied into the reaction tube 4 to generate the pressure fluctuation in the reaction tube 4.

Instead of the $F_2$ gas, a fluorine-based gas such as chlorine fluoride ($ClF_3$) gas, nitrogen fluoride ($NF_3$) gas, HF gas, a mixed gas of the $F_2$ gas and the HF gas, a mixed gas of the $ClF_3$ gas and the HF gas, a mixed gas of the $NF_3$ gas and the HF gas, a mixed gas of the $F_2$ gas and $H_2$ gas, a mixed gas of the $ClF_3$ and the $H_2$ gas, a mixed gas of the $NF_3$ gas and the $H_2$ gas, a mixed gas of the $F_2$ gas and NO gas, a mixed gas of the $ClF_3$ gas and the NO gas and a mixed gas of the $NF_3$ gas and the NO gas may be used as the cleaning gas. Instead of the $N_2$ gas, for example, a rare gas such as argon may be used as the inert gas.

<Temperature Elevating Step: S140>

After the gas cleaning step S130 is completed, the valve 10a is closed to stop the supply of the $F_2$ gas into the reaction tube 4. The heater 3 heats the reaction tube 4 such that the inner temperature of the reaction tube 4 reaches a desired temperature (also referred to as a "third temperature"). The temperature elevating step S140 will be described by way of an example in which the third temperature is higher than the second temperature, that is, an example in which the inner temperature of the reaction tube 4 is changed (elevated) from the second temperature to the third temperature. The heater 3 continuously heats the reaction tube 4 to the third temperature until a multistage purge step S150 described later is completed.

By setting (adjusting) the third temperature higher than the second temperature, it is possible to promote the desorption of the cleaning gas and other adsorbed gases, and it is possible also to promote the sublimation of the particle source from the surfaces of the components in the reaction tube 4, for example, a very small (about several A) compound of a solid material generated by the reaction between the deposits and the cleaning gas (hereinafter, also referred to as a "residual compound").

More preferably, the third temperature is set higher than the temperature of the wafer 7 (that is, the first temperature) in the film-forming step. However, when the inner temperature of the reaction tube 4 is greater than 630° C., the components in the reaction tube 4 may be damaged by the heat.

The temperature of the heater 3 is adjusted (set) such that the inner temperature of the reaction tube 4 may satisfy the conditions described above. For example, the temperature of the heater 3 is set to the third temperature ranging from 400° C. to 630° C., preferably, from 550° C. to 620° C.

<Multistage Purge Step: S150>

The multistage purge step (also referred to as a "pressure swing purge") S150 is performed with the inner temperature of the reaction tube 4 set to the third temperature. In addition, the multistage purge step S150 may be started with the start of the temperature elevating step S140. In the multistage purge step S150, the following first purge step S160 and second purge step S170 are sequentially performed.

<First Purge Step: S160>

In the first purge step S160, a first purge is performed. That is, the reaction tube 4 is purged while the inner pressure of the reaction tube 4 is periodically varied within a first pressure range described later. Specifically, the first purge is performed by performing (repeating) a cycle two or more times (twice or more). The cycle of the first purge includes: elevating the inner pressure of the reaction tube 4 by supplying the purge gas into the reaction tube 4 (also referred to as a "first pressure elevating step"); and lowering the inner pressure of the reaction tube 4 by strengthening the exhaust of the inner atmosphere of the reaction tube 4 (also referred to as a "first pressure lowering step").

In the first pressure elevating step, with the APC valve 17 slightly open, the valves 14a, 14b and 26 are opened to supply the $N_2$ gas into the reaction tube 4. For example, the flow rates of the $N_2$ gas controlled (adjusted) by the MFCs 13a, 13b and 25, respectively, are set to be within a range from 1,000 sccm to 50,000 sccm. For example, a maximum inner pressure of the reaction tube 4 is set to a pressure ranging from 53,200 Pa to 66,500 Pa.

When the first pressure elevating step is performed with the APC valve 17 fully closed, it is possible to increase a range of the pressure swing may be increased. However, the particles such as the residual compound may easily flow back (diffuse) from the exhaust pipe 15 into the reaction pipe 4.

In the first pressure lowering step performed after the first pressure elevating step, the APC valve 17 is fully opened. For example, while maintaining the valves 14a, 14b and 26 open, the flow rates of the $N_2$ gas controlled (adjusted) by the MFCs 13a and 13b, respectively, are reduced within a range from 50 sccm to 500 sccm. For example, a minimum inner pressure of the reaction tube 4 is set to a pressure ranging from 300 Pa to 665 Pa.

The range of the pressure swing in the first purge step S160, that is, a differential pressure between the maximum inner pressure of the reaction tube 4 in the first pressure elevating step and the minimum inner pressure of the reaction tube 4 in the first pressure lowering step is, for example, may range from 52,535 Pa to 66,101 Pa. Due to the differential pressure, a flow of the gas such as the $N_2$ gas is generated throughout the reaction tube 4 when the $N_2$ gas is discharged, and as a result, it is possible to promote the diffusion and the exhaust of the materials such as the cleaning gas and the residual compound sublimated.

<Second Purge Step: S170>

After the first purge step S160 is completed, the second purge step S170 is performed. In the second purge step S170, the concentration of a gas such as the residual cleaning gas is lowered. Therefore, a second purge step S170 (simply referred to as a "second purge") is performed by changing (varying) the inner pressure of the reaction tube 4 periodically with a range smaller than the range of the pressure swing in the first purge step S160. That is, the reaction tube 4 is purged by the second purge. Process conditions other than the inner pressure of the reaction tube 4 in the second purge step S170 are the same as the first purge step S160.

<Temperature Lowering and Returning to Atmospheric Pressure Step: S180>

After the multistage purge step S150 is completed, the inner temperature of the reaction tube 4 is lowered by adjusting the output of the heater 3 (temperature lowering step). That is, the inner temperature of the reaction tube 4 is changed (lowered) from the third temperature to the first temperature. By maintaining the valves 14a, 14b and 26 open, the $N_2$ gas is supplied into the reaction tube 4. Thereby, the inner atmosphere of the reaction tube 4 is filled with the $N_2$ gas (substitution by inert gas), and the inner pressure of the reaction tube 4 is returned to the normal pressure (returning to atmospheric pressure step).

<Boat Unloading Step: S190>

Thereafter, the lid 19 is lowered by the boat elevator 27 and the lower end of the manifold 5 is opened. The empty boat 21 is unloaded out of the reaction tube 4 through the lower end of the manifold 5 (boat unloading step). When the cleaning process including the steps S100 through S190 described above is completed, the film-forming process described above may be resumed.

In the cleaning process described above, the $N_2$ gas is supplied at a constant rate through the nozzles 8a and 8b and the gas supply pipe 24 in the multistage purge step S150. However, the $N_2$ gas may be supplied at periodically changing rates. For example, the gas such as the residual gas and the $N_2$ gas (that is, the purge gas) may be stirred and mixed by repeating: an operation of reducing the flow rate of the $N_2$ gas supplied through the gas supply pipe 24 and discharging (exhausting) the residual gas in the exhaust space S to the furnace opening portion through the plurality of the bottom exhaust ports 4J along with the purge gas being supplied through the nozzles 8a and 8b; and an operation of conversely increasing the flow rate of the $N_2$ gas supplied through the gas supply pipe 24 and pushing out the residual gas in the furnace opening portion through the plurality of the bottom exhaust ports 4J or the plurality of the sub exhaust ports 4G along with the shaft purge gas.

Figure 9:
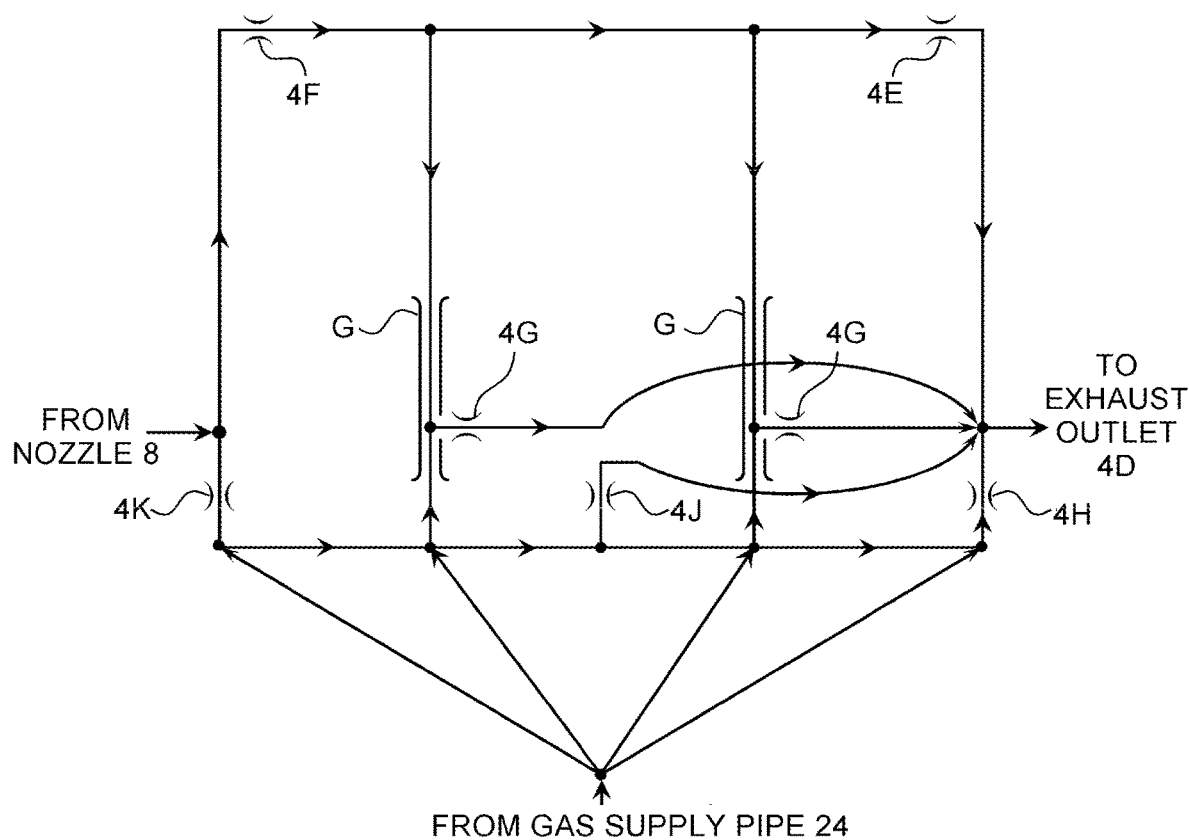
FIG. 9 schematically illustrates a modeled exhaust path in the reaction tube.

FIG. 9 schematically illustrates a modeled exhaust path in the reaction tube 4. The modeled exhaust path is simplified. For example, a fluid resistance (hereinafter simply referred to as "resistance") for the process gas ejected through the main exhaust port 4E to flow downward in the exhaust space S is included in a resistance of the main exhaust port 4E. A resistance for the purge gas ejected through the plurality of the sub exhaust ports 4G or the plurality of the bottom exhaust ports 4J to flow in a lateral direction in the exhaust space S is included in a resistance of the plurality of the sub exhaust ports 4G or a resistance of the plurality of the bottom exhaust ports 4J. Referring to FIG. 9, the shaft purge gas from the gas supply pipe 24 is supplied substantially uniformly over an entire circumference of the furnace opening portion. In addition, most of the process gas from the nozzle 8 is usually sucked into the exhaust outlet 4D through the plurality of the supply slits 4F and the main exhaust port 4E. A portion closer to the exhaust outlet 4D corresponds to the exhaust space S rather than the main exhaust port 4E, the plurality of the sub exhaust ports 4G, the bottom exhaust port 4H and the plurality of the bottom exhaust ports 4J.

Since the plurality of the sub exhaust ports 4G and the bottom exhaust port 4H are distanced apart from a main exhaust path of the process gas, a pressure in the vicinity of the exhaust outlet 4D is low and the gas is drawn toward the exhaust outlet 4D. Therefore, the plurality of the sub exhaust ports 4G forms an upward flow of the shaft purge gas flows in a lower portion of the gap G, and the bottom exhaust port 4H functions as a drain of discharging the surplus shaft purge gas in the furnace opening portion which remains there or has already contributed to diluting the process gas.

A conductance of main exhaust port 4E, a conductance of the gap G and the flow rate of the shaft purge gas flow rate may be set so that an inner pressure of the inner tube 4B of the main exhaust port 4E is substantially the same as or slightly lower than an inner pressure of the main exhaust port 4E. Since the conductance and the pressure difference (total pressure) are both small at an upper portion of the gap G, the movement of gas molecules is suppressed. That is, although there is a concentration difference of the gas such as the purge gas in the vertical direction in the gap G, the amount of the gas advection or the gas diffusion is small because a cross-sectional area of the gap G is small and the distance (length) of the gap G is long. In the lower portion of the gap G, the diffusion barrier is formed by the upward flow of the purge gas, so that the process gas having diffused to the plurality of the sub exhaust ports 4G is exhausted along with the flow of the purge gas toward the exhaust outlet 4D.

Since there is no other highly resistant locations in a path along which the purge gas flows from the plurality of the bottom exhaust ports 4J to the lower end of the exhaust space S, the flow rate of the purge gas is determined by the conductance of the plurality of the bottom exhaust ports 4J itself set to be relatively small. By ejecting the purge gas into the lower end of the exhaust space S, it is possible to generate the gas advection and the gas stirring in a blocked portion (for example, the innermost portion) of the exhaust space S whose cross section is of a C shape. As a result, it is possible to effectively purge the process gas and the cleaning gas having stagnated at the blocked portion. When the flange portion 4C is provided without the plurality of the bottom exhaust ports 4J, it may be difficult to purge the blocked portion of the exhaust space S, which is a dead end, and it may require many times of repetition of performing the pressure swing described above.

When a conductance of the nozzle introduction hole 4K is set to a significant value larger than substantially zero (0), a gentle flow in the vertical direction is generated in the plurality of the nozzle chambers 42. In particular, when the upper ends of the plurality of the nozzle chambers 42 are also opened slightly, it is possible to facilitate gas replacement in the plurality of the nozzle chambers by 42 the gentle flow in the vertical direction while suppressing the influence on the gas distribution in the substrate processing region A.

In general, from the viewpoint of preventing the source gas from entering the furnace opening portion, it is preferable to set the flow rate of the shaft purge gas such that the shaft purge gas flows slightly upward through the nozzle introduction hole 4K. When the bottom exhaust port 4H and the plurality of the bottom exhaust ports 4J are provided excessively, a higher flow rate of the shaft purge gas may be required.

When the nozzle 8 is configured to supply a gas other than the source gas, it is easy to increase the conductance of the nozzle introduction hole 4K. For example, when the nozzle 8 is configured to supply the same kind of purge gas ($N_2$) as the shaft purge gas, the purge gas may flow upward or downward through the nozzle introduction hole 4K by controlling the flow rates (or pressures) of both purge gases. In general, the flow rate of the shaft purge gas is set equal to or greater than a predetermined value. Therefore, when the purge gas from the nozzle 8 is increased, as indicated by a thick arrow in FIG. 3, the purge gas overflowing from the plurality of the nozzle chambers 42 flows to the furnace opening portion through the nozzle introduction hole 4K, then flows into the exhaust space S through a nearby sub exhaust port among the plurality of the sub exhaust ports 4G or a nearby bottom exhaust port among the plurality of the bottom exhaust ports 4J, and may contribute to the purging of the stagnated gas in the exhaust space S.

According to the embodiments, it is possible to provide at least one or more of the following effects.

(a) By providing the plurality of the sub exhaust ports 4G, the purge gas that has flowed into the inner tube 4B is allowed to spontaneously flow into the exhaust space S between the outer tube 4A and the inner tube 4B. Therefore, it is possible to reduce the flow rate of the purge gas that flows into the substrate processing region A.

(b) By providing the bottom exhaust port 4H, the plurality of the bottom exhaust ports 4J and the plurality of the sub exhaust ports 4G, it is possible to improve the exhaust efficiency of the cleaning gas with respect to the exhaust space S.

Other Embodiments

While the technique is described by way of the above-described embodiments, the above-described technique is not limited thereto. The above-described technique may be modified in various ways without departing from the gist thereof. For example, the embodiments are described by way of an example in which the outer tube 4A and the inner tube 4B of the reaction tube 4 are formed as a single body. However, the reaction tube 4 is not limited thereto. The outer tube 4A and the inner tube 4B may be provided as separate components and mounted on the manifold 5. When the outer tube 4A and the inner tube 4B are provided as the separate components, openings between the exhaust space and the furnace opening portion in the vicinity of open ends of the outer tube 4A and the inner tube 4B correspond to the bottom exhaust port 4H and the plurality of the bottom exhaust ports 4J. Alternatively, the outer tube 4A, the inner tube 4B and the manifold 5 may be made of quartz as a single body.

Figure 10:
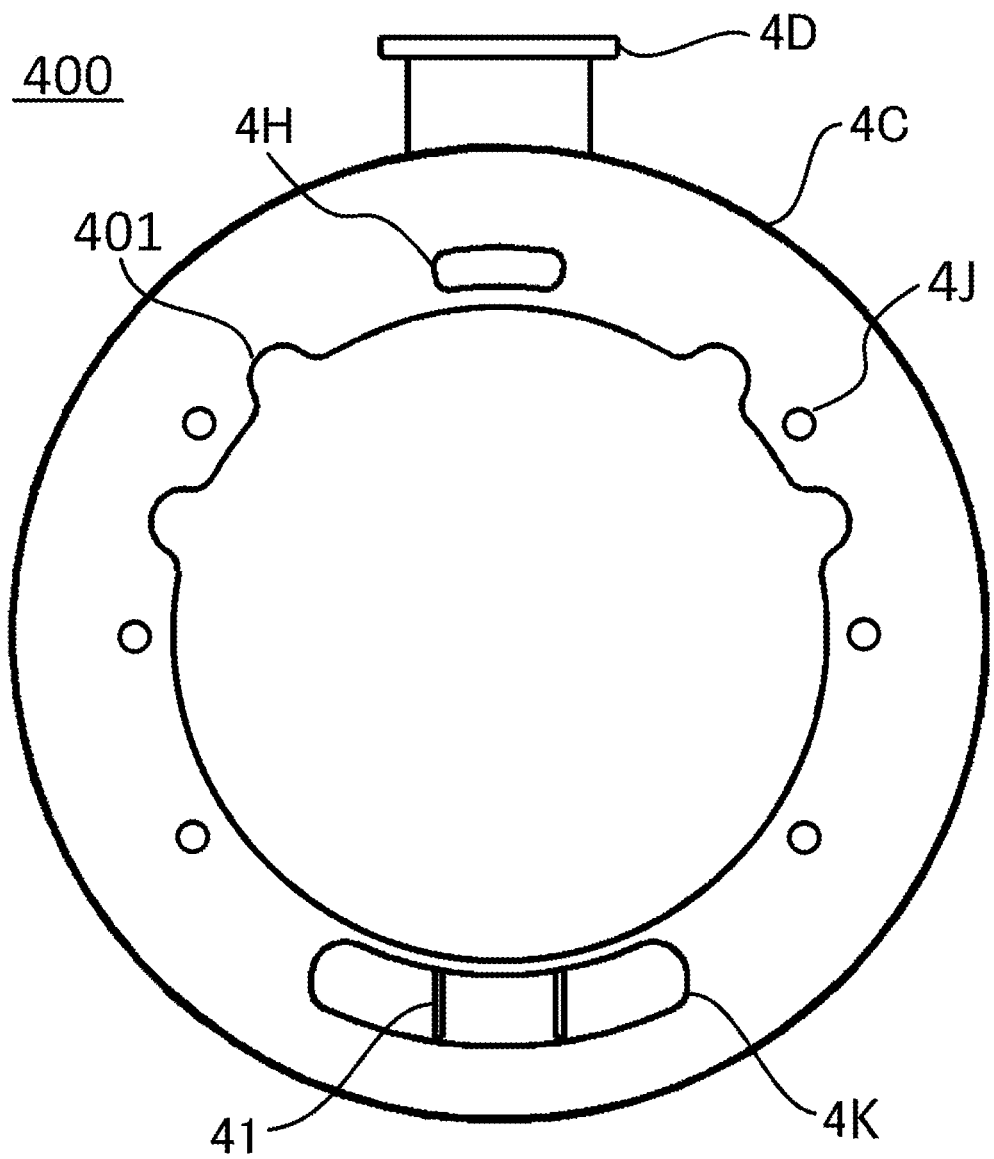
FIG. 10 is a bottom view schematically illustrating a reaction tube of a substrate processing apparatus according to a modified example of the embodiments described herein.

Hereinafter, a modified example of the embodiments will be described. FIG. 10 is a bottom view schematically illustrating a reaction tube 400 of a substrate processing apparatus according to the modified example of the embodiments described herein. The descriptions of the embodiments described above are incorporated herein by reference. According to the modified example, the inner tube 4B includes a plurality of bulges 401 that expands outward. Each of the plurality of the bulges 401 provides a space for installing additional nozzles or sensors inside thereof. The plurality of the bulges 401 continue to expand outward from a lower end to an upper end of the inner tube 4B while maintaining the same shape.

Since the exhaust space S is locally narrowed by the plurality of the bulges 401, the gas is likely to stagnate as it is. According to the modified example, the plurality of the sub exhaust ports 4G is provided at the inner tube 4B further behind a bulge among the plurality of the bulges 401 farthest from the main exhaust port 4E, at least one of the plurality of the bottom exhaust ports 4J is provided at the flange portion 4C, and at least one of the plurality of the bottom exhaust ports 4J is provided with respect to the exhaust space S interposed between the plurality of the bulges 401. According to the modified example, a width of the narrowing of the exhaust space S by t the plurality of the bulges 401 is preferably wider than the gap G.

The embodiments are described by way of an example in which a cleaning process of cleaning the reaction tube is performed after the film-forming process of forming the film on the substrate. However, the above-described technique is not limited thereto. For example, the above-described technique may be effectively applied to processes, for example, a modification process such as an oxidation process and a nitridation process, a diffusion process and an etching process when the by-products are generated, the surface of the reaction tube is eroded, or a precoat film is formed to protect the reaction tube.

Instead of a manufacturing apparatus of a semiconductor device (that is, the substrate processing apparatus described above), the above-described technique may be preferably y applied to a film-forming apparatus of forming a film using a gaseous source.

According to some embodiments in the present disclosure, it is possible to improve the gas stagnation in the gap of the double tube (that is, the gap between the inner tube and the outer tube), to shortening the cleaning time, and to improve the film uniformity between the plurality of the substrates.

What is claimed is:

1. A substrate processing apparatus comprising:
   a reaction tube comprising an outer tube with a closed end and an inner tube provided inside the outer tube, wherein the inner tube is configured to accommodate therein a substrate to be processed;
   a manifold of a cylindrical shape connected to an open end of the reaction tube;
   a lid configured to close one end of the manifold opposite to other end of the manifold connected to the reaction tube;
   a first gas supply pipe configured to supply a cleaning gas inside the reaction tube; and
   a second gas supply pipe configured to supply a purge gas for purging a space inside the manifold,
   wherein the reaction tube further comprises:
      an exhaust space formed between the outer tube and the inner tube into a C-shape in horizontal cross-section, wherein two partition plates are installed respectively at two ends of the C-shape to close the two ends of the C-shape in a manner that the exhaust space is surrounded by the outer tube, the inner tube and the two partition plates without any other partition plate installed in the exhaust space;
      an exhaust outlet formed on the outer tube and communicating with the exhaust space;

a first exhaust port provided in the inner tube so as to face the substrate and configured to discharge a process gas into the exhaust space; and
a plurality of second exhaust ports formed at a bottom of the exhaust space of the C-shape, through which the exhaust space and the space inside the manifold communicate with each other,
wherein at least one of the plurality of the second exhaust ports is configured to promote an exhaust of a stagnated gas in the exhaust space distanced away from the first exhaust port, and
wherein the exhaust space is directly in fluid communication with both the exhaust outlet and the first exhaust port.

2. The substrate processing apparatus of claim 1, further comprising:
a rotating mechanism configured to rotate the substrate through the lid;
a substrate retainer rotated by the rotating mechanism while supporting the substrate;
a heat insulating assembly of a cylindrical shape configured to insulate a space between the substrate retainer and the lid; and
a plurality of third exhaust ports opened at the inner tube at locations facing the heat insulating assembly,
wherein, by the plurality of the third exhaust ports, the purge gas supplied through the second gas supply pipe is suppressed from passing through a gap between the inner tube and a side surface of the heat insulating assembly and reaching the substrate retainer.

3. The substrate processing apparatus of claim 2, further comprising:
at least one nozzle provided between the outer tube and the inner tube so as to face the first exhaust port and configured to supply the process gas into the inner tube; and
a nozzle chamber configured to surround a periphery of the at least one nozzle while communicating with the inner tube,
wherein two of the third exhaust ports are respectively arranged in vicinity of the two partition plate.

4. The substrate processing apparatus of claim 3, wherein the reaction tube further comprises a flange portion configured to close the exhaust space in vicinity of the open end of the reaction tube,
the at least one of the plurality of the second exhaust ports is provided on the flange portion at a position opposite to the first exhaust port,
the heat insulating assembly comprises at least one heat insulating plate provided therein at a height corresponding to the plurality of the third exhaust ports, and
a cavity in which no heat insulating plate is disposed is provided above the at least one heat insulating plate.

5. The substrate processing apparatus of claim 3, wherein the at least one nozzle comprises a plurality of nozzles,
the nozzle chamber comprises a plurality of partition plates comprising the two partition plates and configured to separate the plurality of the nozzles from each other,
each of sections of the nozzle chamber divided by the plurality of the partition plates communicates with an inside of the inner tube only by one or more supply slits opened so as to face the substrate, and
at least one of the sections comprises a nozzle introduction hole provided at a lower end thereof to communicate with the space inside the manifold with a predetermined conductance.

6. The substrate processing apparatus of claim 5, wherein an inert gas is supplied to one of the plurality of nozzles provided in the at least one of the sections comprising the nozzle introduction hole.

7. The substrate processing apparatus of claim 5, wherein each of the sections divided by the plurality of the partition plates, and the one or more supply slits are formed at the plurality of the partition plates to communicate with an inner space surrounded by the inner tube.

8. The substrate processing apparatus of claim 5, further comprising:
a controller configured to control supplying the purge gas into the reaction tube alternately from the second gas supply pipe and the at least one nozzle after supplying the cleaning gas from the first gas supply pipe.

9. The substrate processing apparatus of claim 3, wherein a conductance of a path through which the purge gas is exhausted by flowing to the exhaust space from the plurality of the second exhaust ports is greater than a conductance of a path through which the purge gas is exhausted by passing through the side surface of the heat insulating assembly or the nozzle chamber and flowing to the exhaust space from the first exhaust port, and
sizes of the second exhaust ports and a flow rate of the purge gas are set so that a concentration of the process gas having entered the space inside the manifold is equal to or lower than a specified value.

10. A quartz reaction tube comprising:
an outer tube and an inner tube each closed at one end;
a flange portion configured to connect other end of the outer tube with other end of the inner tube;
an exhaust outlet communicating with an exhaust space formed between the outer tube and the inner tube into a C-shape in horizontal cross-section, wherein two partition plates are installed respectively at two ends of the C-shape to close the two ends of the C-shape in a manner that the exhaust space is surrounded by the outer tube, the inner tube and the two partition plates without any other partition plate installed in the exhaust space;
a first exhaust port provided in the inner tube so as to face a substrate and configured to discharge a process gas into the exhaust space;
one or more supply slits configured to supply the process gas into the inner tube at positions facing the first exhaust port between the outer tube and the inner tube;
a plurality of second exhaust ports provided at the flange portion through which an inside and an outside the exhaust space communicate with each other; and
a plurality of third exhaust ports opened at the inner tube at locations facing a heat insulating assembly provided in the inner tube in vicinity of the flange portion,
wherein at least one of the plurality of the second exhaust ports is configured to promote an exhaust of a stagnated gas in the exhaust space distanced away from the first exhaust port, and
the exhaust space is directly in fluid communication with both the exhaust outlet and the first exhaust port.

* * * * *